(12) United States Patent
Yamazaki et al.

(10) Patent No.: US 6,249,476 B1
(45) Date of Patent: Jun. 19, 2001

(54) SEMICONDUCTOR MEMORY DEVICE SUITABLE FOR MOUNTING MIXED WITH LOGIC CIRCUIT, HAVING SHORT CYCLE TIME IN READING OPERATION

(75) Inventors: Akira Yamazaki; Naoya Watanabe, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/654,876

(22) Filed: Sep. 5, 2000

(30) Foreign Application Priority Data

Sep. 7, 1999 (JP) ................................................ 11-253364

(51) Int. Cl.$^7$ ...................................................... G11C 8/00
(52) U.S. Cl. ................................. 365/230.03; 365/230.06
(58) Field of Search ............................ 365/230.03, 230.06

(56) References Cited

U.S. PATENT DOCUMENTS 5,204,842 * 4/1993 Umeki .............................. 365/230.03

OTHER PUBLICATIONS

"64Mb 6.8ns Random ROW Acess DRAM Macro for ASICs", T. Kimura et al., IEEE ISSCC 1999, Digest of Technical Papers, vol. 42, pp. 416–417 and 486.

"A Configurabel DRAM Macro Design for 2112 Derivative Organizations to be Synthesized Using A Memory Generator", T. Yabe et al., IEEE ISSCC 1998, Digest of Technical Papers, vol. 41, pp. 72–73 and 415.

* cited by examiner

*Primary Examiner*—Trong Phan
(74) *Attorney, Agent, or Firm*—McDermott, Will & Emery

(57) ABSTRACT

The DRAM macro includes a memory array having a plurality of memory cells, a read data line pair RDL provided extending in the column direction over the memory array, a read column decoder generating a column selection signal for selectively coupling the read data line pair RDL with a plurality of sense amplifiers, and a preamplifier for amplifying potential difference generated on the read data line pair RDL. The preamplifier and the read column decoder are arranged in areas opposite to each other with the memory array placed therebetween.

14 Claims, 20 Drawing Sheets

SEMICONDUCTOR MEMORY DEVICE SUITABLE FOR MOUNTING MIXED WITH LOGIC CIRCUIT, HAVING SHORT CYCLE TIME IN READING OPERATION

BACKGROUND OF THE INVENTION

1. Field of the Invention

The present invention relates to a semiconductor memory device, and more specifically, to a semiconductor memory device suitable for mounting mixed with a logic circuit such as a logic device and a microprocessor. More specifically, the present invention relates to a configuration of a semiconductor memory device for reducing cycle time in a reading operation of a DRAM (Dynamic Random Access Memory) mounted together with logic circuitry.

2. Description of the Background Art

DRAM system LSI (Large Scale Integrated Circuit Device) having a DRAM and a logic device or a microprocessor integrated on one same semiconductor substrate has come to be widely used. The DRAM embedded system LSI is advantageous over the conventional system in which separate DRAM and logic device are soldered on a printed circuit board in the following points.

(1) Consideration of pin terminals of the separate DRAM is unnecessary, and therefore data bus width between the DRAM and the logic can be widened, which leads to improved data transfer rate and hence improved system performance;

(2) A data bus formed on a semiconductor substrate has smaller parasitic capacitance as compared with a line on a printed board, and therefore charging/discharging current of signal line can be reduced, which leads to smaller current consumption at the time of data transfer; and (3) Single packaging becomes possible, and data bus lines and control signal lines on the printed board can be reduced, so that occupation area on the printed board can be reduced.

FIG. 19 represents an example of a conventional DRAM embedded system LSI configuration.

Referring to FIG. 19, in the DRAM embedded system LSI, a logic circuit LG and a DRAM macro are integrated on one semiconductor substrate chip CH.

The DRAM macro includes memory arrays MA0 and MA1 each having a plurality of memory cells arranged in a matrix of rows and columns, row decode circuits XD0 and XD1 provided for memory arrays MA0 and MA1, respectively, for selecting an address-designated row of the corresponding memory arrays MA0 and MA1, column decode circuits YD0 and YD1 provided for memory arrays MA0 and MA1, respectively, for selecting an address-designated column of memory arrays MA0 and MA1, data paths DP0 and DP1 for communicating data with the column of memory cells selected by column decode circuits YD0 and YD1, and a control circuit CG controlling data access operation to memory arrays MA0 and MA1.

Data paths DP0 and DP1 are coupled to logic circuit LG through data buses DB0 and DB1, and control circuit CG is coupled to logic circuit LG through a control bus CTB. In FIG. 19, data buses DB0 and DB1 transmit 128 bits of write data and 128 bits of read data separately.

FIG. 20 is a schematic representation of the configurations of memory arrays MA0 and MA1 shown in FIG. 19. Memory arrays MA0 and MA1 are generally represented as one memory array MA in FIG. 20, as the memory arrays have identical configurations.

Memory array MA includes a plurality of memory cell blocks MCB arranged in a matrix of rows and columns. Though not explicitly shown, memory cells are arranged in a matrix of rows and columns in memory cell block MCB. For each memory cell block MCB, local IO line pairs LIOs for communicating data with the corresponding memory cell block are provided. The pair of local IO lines transmit signals complementary to each other.

Sense amplifier groups SAs are arranged corresponding to respective memory cell blocks MCB. Sense amplifier groups SAs have shared sense amplifier scheme, and shared by memory cell blocks adjacent in the column direction. The sense amplifier groups SAs include sense amplifier circuits SA each provided corresponding to each column of the corresponding memory cell block, for sensing, amplifying and latching data of the address-designated memory cell column when activated. Sense amplifier groups SAs are selectively coupled to the corresponding local IO line pairs LIOs.

Word lines WLs are arranged commonly to memory cell blocks MCB arranged aligned in the row direction. In operation, one word line WL among word lines belonging to one row block (a block consisting of a plurality of memory cell blocks arranged aligned in the row direction) is driven to the selected state.

In an area between memory cell blocks adjacent to each other in the row direction and the area outside the memory cell blocks (these areas will be referred to as interblock areas), global IO line pairs GIO0 to GIO127 are arranged extending in the column direction. Four global IO line pairs are arranged commonly to memory cell blocks aligned in the column direction. Four pairs of local IO lines LIOs are arranged for each memory cell block, and four pairs of local IO lines LIOs provided corresponding to each memory cell block MCB in one row block are each coupled to the corresponding global IO line pair through an IO switch IOSW.

Each of the global IO line pairs GIO0 to GIO127 transmits mutually complementary signals, and coupled to a data path shown in FIG. 19 and coupled to logic circuit LG through a read/write circuit in the data path.

In the same interconnection layer as global IO line pairs GIO0 to GIO127, a column selection line CSL is arranged extending in the column direction over memory array MA. Column selection lines CSLs are shared by memory cell blocks MCB arranged aligned in the column direction. By IO switch IOSW, local IO line pairs LIOs of the selected row block are coupled to global IO line pairs GIO0 to GIO127, and local IO line pairs LIOs of nonselected row blocks are separated from global IO line pairs GIO0 to GIO127. Therefore, four columns are simultaneously selected in each column block (a block constituted by memory block cell blocks arranged aligned in the column direction), and four local IO line pairs LIOs are coupled to the corresponding global IO line pairs.

FIG. 21 is a block diagram representing arrangements of circuits and flow of control signals related to a reading operation in a conventional DRAM macro.

Referring to FIG. 21, difference in access time between data reading from a memory cell connected to a sense amplifier SAf positioned at a farthest point from a control circuit and data reading from a memory cell connected to a sense amplifier SAn positioned at the nearest point on the memory array will be considered.

The sense amplifier SAf at the farthest point is coupled selectively to local IO line pair LIOf by column selection line CSLf, and data read to local IO line pair LIOf is transmitted to the corresponding global IO line pair GIOf. Potential difference generated on global IO line pair GIOf because of the coupling with sense amplifier SAf is amplified by preamplifier PAf, and read data is taken out.

Similarly, the sense amplifier SAn at the nearest point is selectively coupled through local IO line pair LIOn to global IO line pair GIOn, by column selection line CSLn. Potential difference generated on global IO line pair GIOn because of the coupling with sense amplifier SAn is amplified by preamplifier PAn and the read data is taken out.

In the following, signal lines, control signals and circuits having reference characters with a suffix "f" in the specification represent those provided corresponding to the sense amplifier SAf at the farthest point. Similarly, those designated by reference characters with suffix "n" represent those provided corresponding to the sense amplifier SAn at the nearest point.

Control signal CG takes in a read command and an address in synchronization with an external clock in a reading operation, and generates an equalize signal GIOEQ to cause precharge/equalize operation on global IO line pair, a preamplifier activating signal PAE designating activation timing of preamplifier PA, and read predecode signals YA <3:0> and YB <3:0> input to the column decoder. Here, each of the read predecode signals YA <3:0> and YB <3:0> is a signal generated by a logical product operation between a signal obtained by predecoding two bits of the column address and a control signal CDE determining activation timing of the column selection line. Each column decoder YD selects one of sixteen sense amplifiers arranged corresponding to each memory cell block, in accordance with the read predecode signals YA <3:0> and YB <3:0>.

The column selection line CSLf corresponding to the sense amplifier SAf at the farthest point is driven by column decoder YDf, and column selection line CSLn corresponding to the sense amplifier SAn at the nearest point is driven by column decoder YDn.

Here, line delays of signals GIOEQ, PAE, YA and YB will be represented as $\Delta tGIOEQ$, $\Delta tPAE$, $\Delta tY$ and $\Delta tY$. For simplicity of description, it is assumed that the line delays are equal to each other. As these signals are propagated in one direction, relative relations between each of the signals is constant, when each position of the preamplifier on the data path is used as a reference. Therefore, by considering timings of change of various signals related to the reading operation with the positions of respective preamplifiers used as reference, the influence of delays $\Delta tGIOEQ$, $\Delta tPAE$, $\Delta tY$ and $\Delta tY$ can be eliminated.

FIG. 22 is a timing chart representing a problem in a reading operation of a conventional DRAM macro.

Referring to FIG. 22, VCSLn and VGIOn represent variation in potential level on column selection line CSLn and variation in potential difference generated on global IO line pair GIOn at the position of preamplifier PAn. Similarly, VCSLf and VGIOf represent variation in potential level of column selection line CSLf and variation in potential difference generated on global IO line pair GIOf at the position of preamplifier PAf. Further, as already described, preamplifier activating signal PAE and equalize signal GIOEQ are propagated in the same direction as read predecode signals YA <3:0> and YB <3:0>. Therefore, variations in potential levels of preamplifier activating signal PAE and equalize signal GIOEQ at respective preamplifier positions can be represented by the same timing relative to the timing when the corresponding column decoder drives the column selection line as a reference.

The time t0 is the timing when column decoder YDn outputs a column selection signal to column selection line CSLn for column selection line CSLn and global IO line pair GIOn, and the timing when column decoder YDf generates a column selection signal to column selection line CSLf for column selection line CSLf and global IO line pair GIOf. By the time t0 when the corresponding column selection line CSL is activated, equalize operation for each global IO line pair is completed, and global IO line equalize signal GIOEQ is inactivated.

At the sense amplifier SAn at the nearest point, the distance between sense amplifier SAn and column decoder YDn driving column selection line CSLn is short. Therefore, the data amplified by the sense amplifier is transmitted to global IO line pair GIOn starting from time t0.

Potential difference generated on global IO line pair GIOn attains to a preamplifier sensitivity (200 mV in FIG. 22) at time t2 after necessary time period tRE for amplifying read data on global IO line from time point t0, and it becomes possible to establish or define the read data.

As for the sense amplifier SAf at the farthest point, line delay $\Delta tCSL$ over column selection line CSLf from column decoder YDf to sense amplifier SAf is innegligible. Further, the data read from sense amplifier SAf after activation by column selection line CSLf is transmitted over global IO line pair GIOf with line delay $\Delta tGIO$ in a direction opposite to the direction of signal propagation over column selection line. Therefore, an innegligible line delay results because of the sum of these. In FIG. 22, the sum of line delays is represented as $\Delta tCSL + \Delta tGIO$.

Therefore, VGIOf exceeds the preamplifier sensitivity at time point t4 after tRE from time point t1.

When preamplifier PAn is activated by preamplifier activating signal PAE from the time point t4, it becomes possible to take out the data read from the memory cell connected to sense amplifier SAn at the nearest point at time point t6 after the lapse of preamplifier activating period tPAE necessary for the data to be established after the activation of the preamplifier. After reading the read data and the read data is established, the global IO line pair is equalized and initialized to the precharge potential, and thus at time t7 after the equalizing period tEQ from the time point t6, one read cycle for the memory cell connected to SAf at the farthest point is completed.

In this manner, when an access is made to the memory cell connected to the sense amplifier SAf at the farthest point, the time point when the read data appears on the global IO line pair at the position of the preamplifier is delayed by $\Delta tCSL + \Delta tGIO$ from the time when an access is made to the memory cell connected to the sense amplifier SAn at the nearest point.

Therefore, the time for activating the preamplifiers and the start of equalization of the global IO line pair must be so set as to accommodate the access to the memory cell connected to the sense amplifier SAf at the farthest point. Therefore, the minimum read cycle time in the conventional DRAM macro is $\Delta tCSL + \Delta tGIO + tRE + tPAE + tEQ$.

As described above, in the conventional configuration, it has been necessary to define as the minimum read cycle time the time period including line delay caused by the column selection line and the global IO line pair, which hinders increase in speed of operation.

SUMMARY OF THE INVENTION

An object of the present invention is to provide a configuration of a semiconductor memory device suitable to be mounted together with a logic circuit, which enables higher speed of operation by reducing cycle time in a reading operation, in a DRAM to be mounted together with a logic circuit.

In summary, the present invention provides a semiconductor memory device including a memory cell array, a plurality of sense amplifiers, a plurality of read data lines, a read data amplifying circuit, a plurality of read gate circuits, a column decoder circuit and a plurality of column selection lines.

The memory cell array has a plurality of memory cells arranged in a matrix of rows and columns, and divided into a plurality of sub row arrays along the row direction. The plurality of sense amplifiers are provided for each of the plurality of sub arrays, and each of the plurality of sense amplifiers is provided for each column of the memory cells. The plurality of read data lines are arranged commonly over the plurality of sub row arrays, one for every N columns of memory cells (N: natural number not smaller than 2). The read data amplifying circuit amplifies a data signal on the read data line. Each of the plurality of read gate circuits is provided between the plurality of sense amplifiers and the corresponding one of the plurality of read data lines. The column decode circuit generates a plurality of column selection signals for selectively activating one of N columns of memory cells which are provided corresponding to respective read data lines. The plurality of column selection lines transmits corresponding one of the plurality of column selection signals to respective read gate circuits.

The column decode circuit and the plurality of column selection lines are arranged such that time necessary for transmitting a column selection signal corresponding to a read gate circuit of which path from the preamplifier circuit is relatively long among the plurality of read gate circuits corresponding to one read data line is made relatively short.

Therefore, an advantage of the present invention is that, as the column decoder and the column selection lines are arranged such that sense amplifiers having longer path to the preamplifier amplifying the data on the read data line are coupled starting from that one having the longest path to the read data line, the influence of line delay of the control signal on the minimum cycle time in reading operation can be reduced, so that higher speed of operation is attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
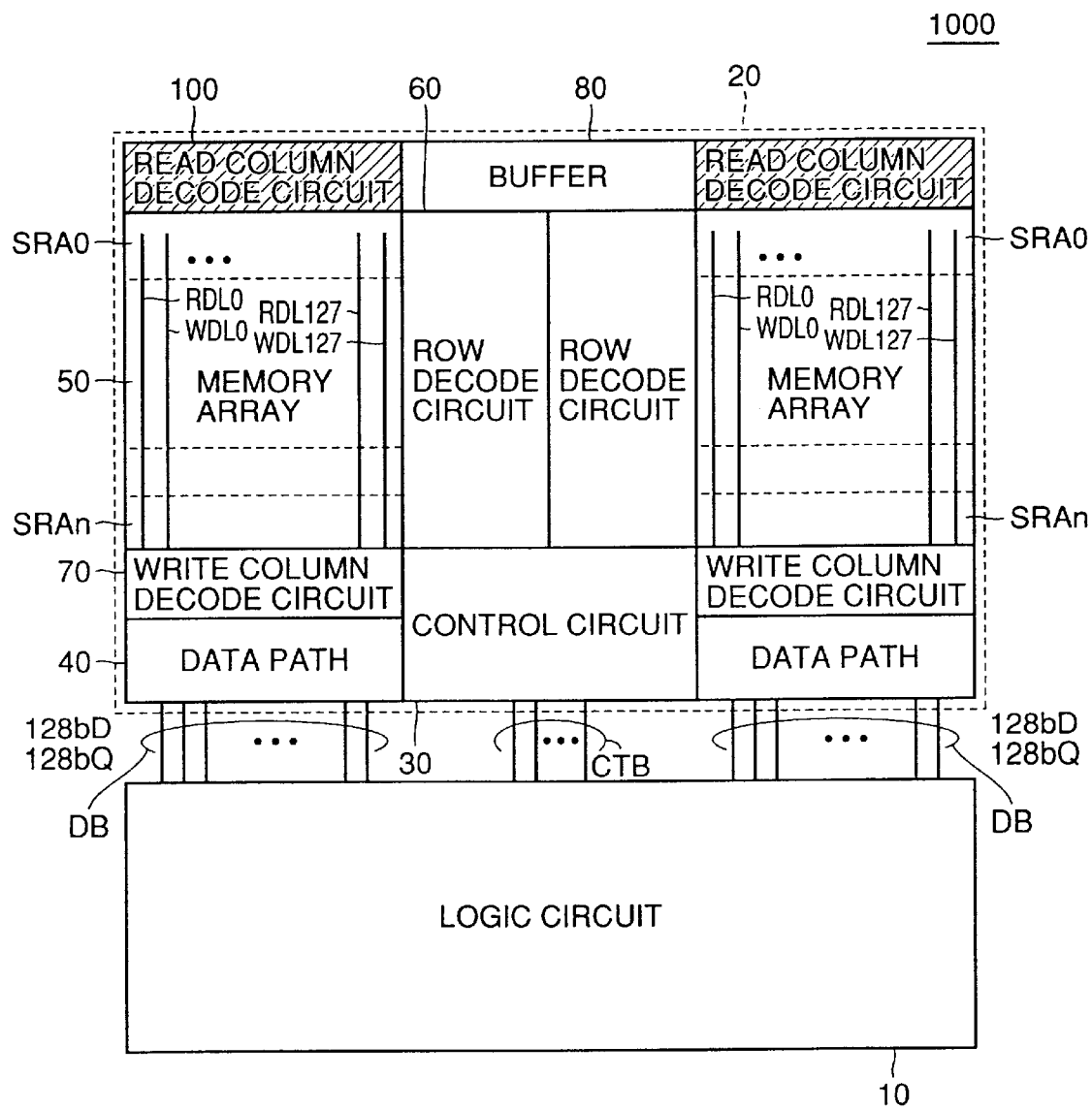
FIG. 1 is a schematic block diagram representing an overall configuration of a DRAM embedded system LSI 1000 in accordance with a first embodiment of the present invention.

Embodiments of the present invention will be described in detail in the following with reference to the figures. In the figures, the same reference characters denote the same or corresponding portions.

First Embodiment

FIG. 1 is a schematic block diagram representing an overall configuration of a DRAM embedded system LSI 1000 in accordance with the first embodiment of the present invention.

Referring to FIG. 1, DRAM embedded system LSI 1000 includes a logic circuit 10 and a DRAM macro 20 storing data for logic circuit 10. DRAM macro 20 includes a plurality of memory arrays 50 having a plurality of memory cells arranged in a matrix of rows and columns. As the memory arrays have identical configuration, the configuration of one representative memory array will be described in the following.

Memory array 50 is divided into n+1 (n: natural number) sub row arrays SAR0 to SRAn along the row direction. On memory array 50, data lines for transmitting data from the selected memory cell are arranged commonly to sub row arrays SAR0 to SRAn. In the present embodiment, a configuration in which 128 data are transmitted independently as read data/write data for each memory array will be described as an example. More specifically, referring to FIG. 1, read data line pairs RDL0 to RDL127, and write data line pairs WDL0 to WDL127 transmitting write data to the selected memory cell are arranged extending in the column direction over memory array 50. In the following, the read data line pairs RDL0 to RDL127 are also generally represented as read data line pair RDL. Further, write data line pairs WDL0 to WDL127 are also represented generally as write data line pair WDL.

Each of the read data line pairs RDL and write data line pairs WDL transmits complementary signals and coupled to logic circuit 10 through a write/read circuit in data path 40. In the block diagram referred to in the following, the pair of signal lines transmitting complementary signals are also represented as a single signal line.

DRAM macro 20 includes a control circuit 30 receiving a command signal and an address signal from logic circuit 10 through a control bus CTB for controlling data access operation to the memory array, a row decode circuit 60 responsive to an instruction from control circuit 30 for selecting a row of a memory cells in the memory array, and a write column decode circuit 70 and a read column decode circuit 100 for selecting a column of memory cells. The configuration of the DRAM macro in accordance with the first embodiment is characterized in that the write column decode circuit and the read column decode circuit are provided independent from each other, and that read column decode circuit 100 is positioned opposite to the data path 40 where preamplifier for amplifying potential difference on the read data line pair RDL is positioned.

In each sub row array, a word line WL (not shown) is arranged commonly to the memory cells belonging to the same row. Further, bit lines BL, /BL (not shown) are provided for each column of memory cells. A sense amplifier for amplifying data read to the bit lines is arranged for each sub row array.

Figure 2:
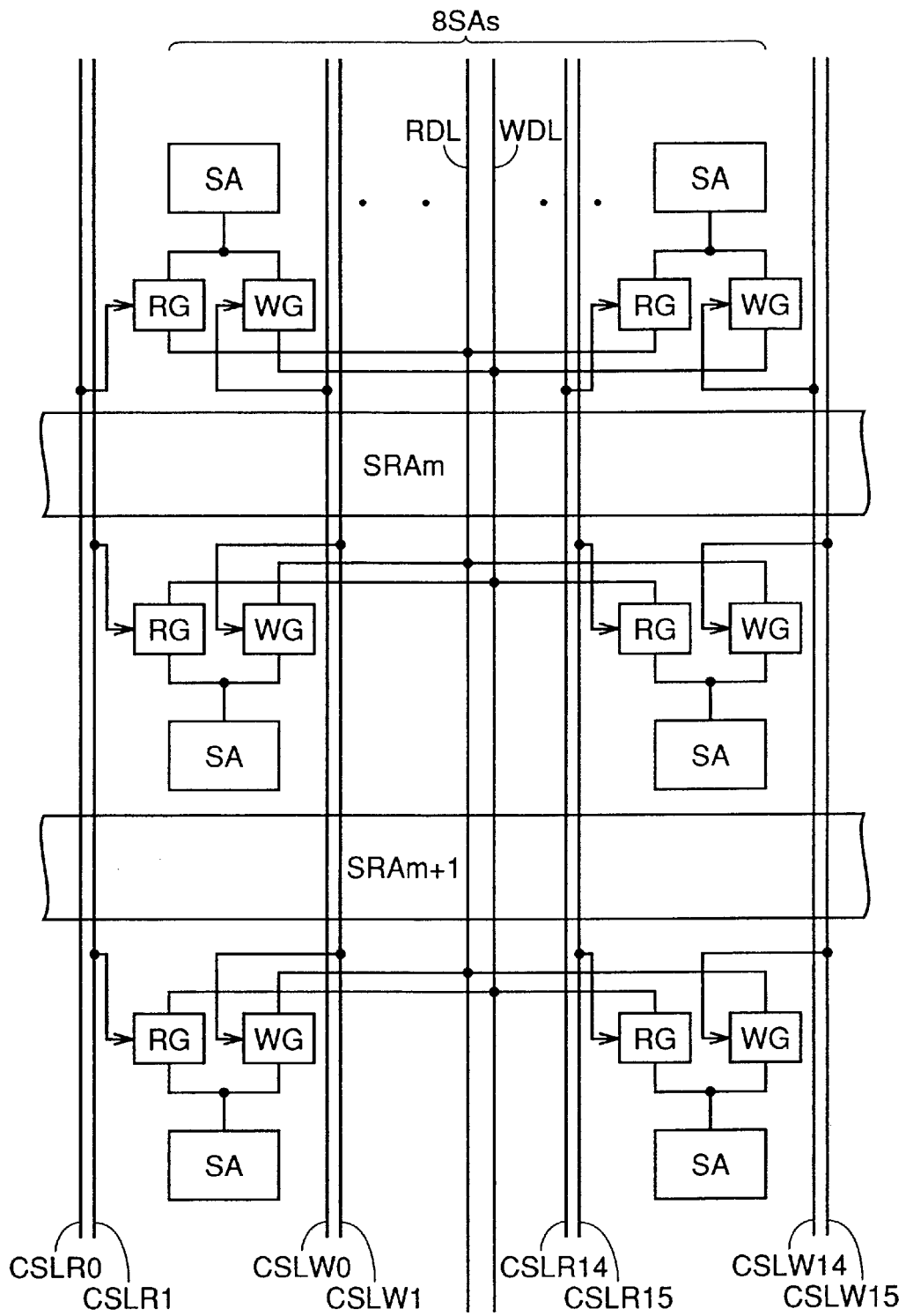
FIG. 2 is a schematic block diagram related to a column selecting operation in the memory array.

FIG. 2 is a schematic block diagram related to the column selecting operation in the memory array.

FIG. 2 shows an example in which the read data line pair RDL and the write data line pair WDL are arranged at every sixteen columns of memory cells. The sense amplifier SA is provided corresponding to each column of the memory cells for each sub array, and therefore, sixteen sense amplifiers provided corresponding to sub row arrays SRAm (m: integer from 0 to n−1) are selectively coupled to a set of data line pairs RDL and WDL, as shown in FIG. 2. Between sense amplifier SA and data line pair RDL and WDL, a read gate RG and write gate WG are provided, respectively.

By read column selection lines CSLR0 to CSLR15 provided for respective columns of memory cells commonly over all sub row arrays, one read gate RG is selected, and the corresponding sense amplifier SA and the read data line pair RDL are coupled. By the write column selection lines CSLW0 to CSLW15 provided in the similar manner, one write gate WG is selected, and the corresponding sense amplifier SA and the write data line pair WDL are coupled. The sense amplifier has a shared sense amplifier scheme, and arranged divided at an area adjacent to the corresponding sub row arrays. In FIG. 2, sixteen sense amplifiers corresponding to one data line pair are arranged divided eight by eight into the upper and lower areas of the sub row array, and the sense amplifier group arranged between sub row arrays SRAm and SRAm+1 is shared by these two sub row arrays.

Figure 3:
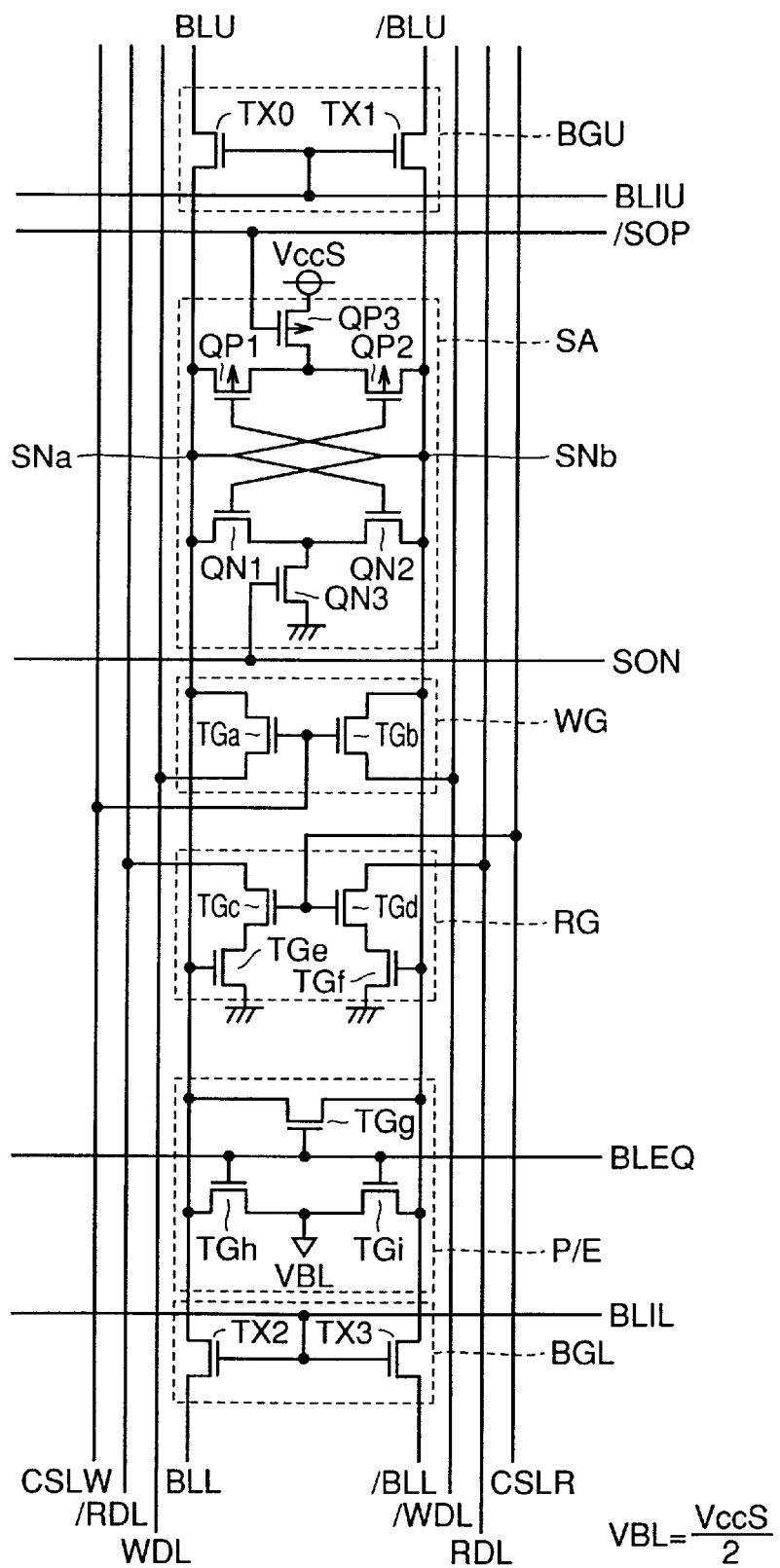
FIG. 3 is a circuit diagram representing a circuit configuration related to a sense amplifier.

FIG. 3 is a circuit diagram representing circuit configuration related to the sense amplifier.

Referring to FIG. 3, sense amplifier SA is coupled to bit lines BLU and /BLU of the upper sub row array through a bit line separation gate BGU, and coupled to bit lines BLL and /BLL of the lower sub row array through bit line isolation gate BGL. Bit line isolation gates BGU and BGL are rendered conductive in accordance with bit line isolation signals BLIU and BLIL in the standby state, and only that bit line which corresponds to the sub row array including the selected memory cell is coupled to the sense amplifier SA in the active state.

Sense amplifier SA includes cross coupled P channel MOS transistors QP1 and QP2, and a P channel MOS transistor PQ3 responsive to activation of sense amplifier activating signal /SOP for transmitting sense power supply voltage VccS to the sources of MOS transistors QP1 and QP2. Sense amplifier SA further includes cross coupled N channel MOS transistors QN1 and QN2, and an N channel MOS transistor QN3 rendered conductive in response to activation of sense amplifier activating signal SON for transmitting the ground voltage to the sources of MOS transistors QN1 and QN2. Sense amplifier SA senses, amplifies and latches memory cell data on sense nodes SNa and SNb when activated.

Write gate WG includes transfer gates TGa and TGb which are rendered conductive in response to a column selection signal on write column selection line CSLW for electrically coupling sense nodes SNa and SNb to write data line pair WDL and /WDL.

Read gate RG includes N channel MOS transistors TGe and TGf connected to sense nodes SNa and SNb at their gates, and N channel MOS transistors TGc and TGd which are rendered conductive in accordance with a column selection signal on read column selection line CSLR, for electrically coupling drain nodes of MOS transistors TGe and TGf to read data line pair RDL and /RDL, respectively. In the read gate RG, in response to the signal potentials on sense nodes SNa and SNb, one of the transistors TGe and TGf is rendered conductive, so that one line of the read data line pair RDL and /RDL is discharged to the level of the ground voltage.

In FIG. 3, the signal lines transmitting the complementary signals transmitted over read data line pair and the write data line pair are represented independent from each other. More specifically, the read data line pair is represented as complementary signal lines RDL and /RDL, and similarly, the write data line pair is represented as complementary signal lines WDL and /WDL.

For the sense nodes SNa and SNb, a precharge/equalize circuit P/E is further provided, which is activated in response to a bit line equalize designating signal BLEQ and precharges and equalizes sense nodes SNa and SNb at an intermediate voltage VBL (=VccS/2). The bit line precharge/equalize circuit P/E has an N channel MOS transistor TGg rendered conductive when bit line equalize designating signal BLEQ is activated, for short-circuiting sense nodes SNa and SNb, and N channel MOS transistors TGh and TGi rendered conductive when the bit line equalize designating signal BLEQ is activated, for transmitting the intermediate voltage VBL to sense nodes SNa and SNb, respectively.

As the read gate RG is constituted by differential stages of MOS transistors TGe and TGf, it becomes possible to drive the read column selection line CSLR to the selected state before the completion of sensing operation of sense amplifier SA, and thus high speed data read is realized. This is because the data reading operation of read gate RG does not have any influence of the sensing operation of sense amplifier circuit SA.

In the semiconductor memory device in accordance with the first embodiment of the present invention, IO separation configuration is employed as described with reference to FIG. 3. When a three state buffer is used as a driver portion of the column decoder, the so-called IO common configuration is possible, with the column selection line shared for reading/writing.

Figure 4:
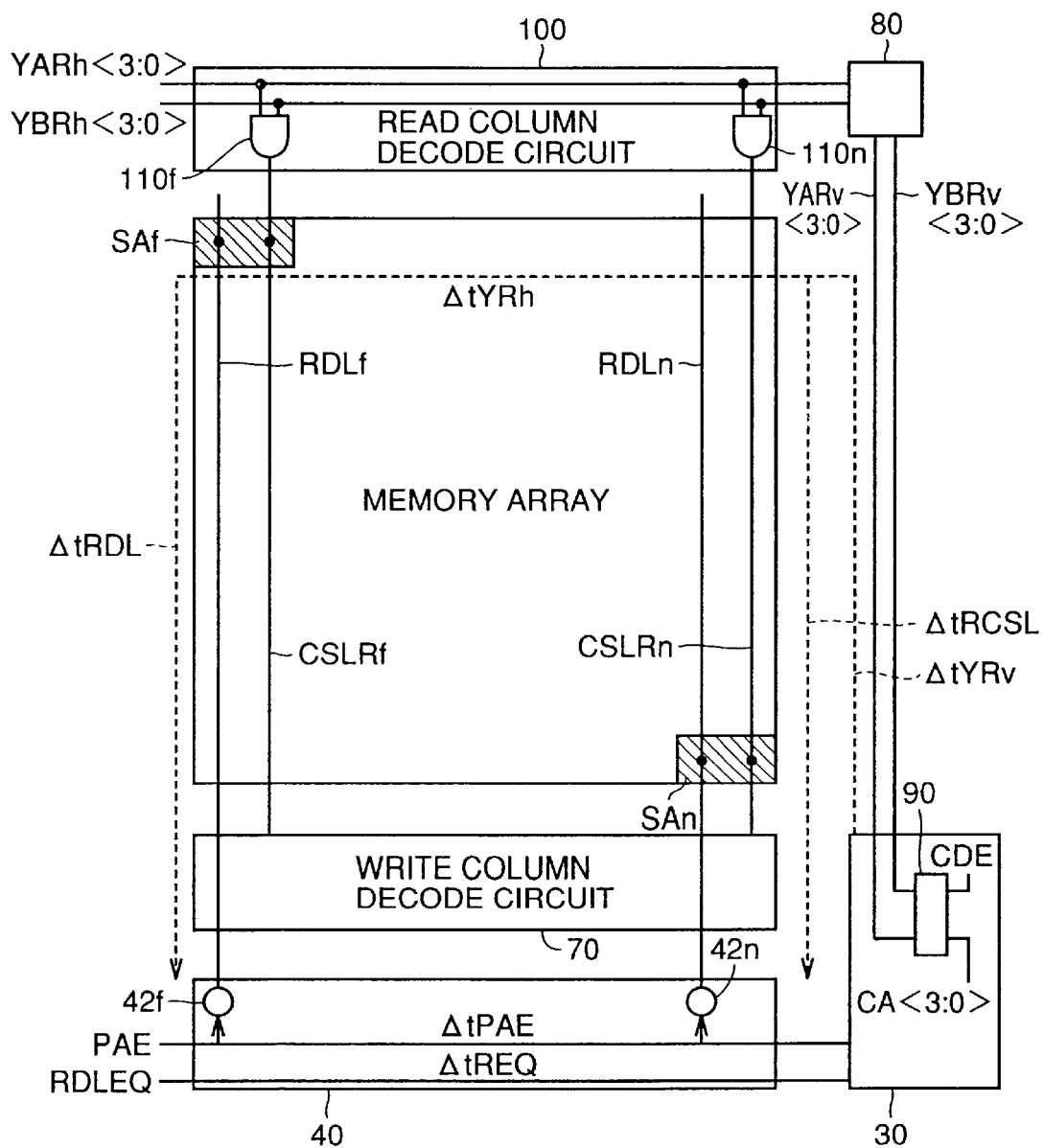
FIG. 4 is a block diagram representing circuit arrangement and flow of control signals related to a reading operation in the DRAM macro in accordance with the first embodiment.

FIG. 4 is a block diagram representing circuit arrangement and flow of control signals related to the reading operation in the DRAM macro in accordance with the first embodiment.

Referring to FIG. 4, a sense amplifier positioned at the farthest point when viewed from control circuit 30 on the memory array, that is, the sense amplifier corresponding to the left most memory cell column belonging to sub row array SAR0 in FIG. 1 will be represented as sense amplifier SAf at the farthest point. Similarly, a sense amplifier positioned at the nearest point when viewed from the control circuit 30, that is, the sense amplifier corresponding to the right most memory cell column belonging to the sub row array SRAn on FIG. 1 will be represented as sense amplifier SAn at the nearest point.

The sense amplifier SAf at the farthest point is coupled to read data line pair RDLf by a read gate (not shown) which is activated by read column selection line CSLRf Potential difference generated on read data line pair RDLf because of the coupling with sense amplifier SAf is amplified by the preamplifier, and read data is taken out. The read data line pair RDLf corresponds to RDL0 on the representation of FIG. 1.

Similarly, sense amplifier SAn at the nearest point is coupled to read data line pair RDLn by a read gate (not shown) activated by read column selection line CSLRn. The potential difference generated on read data line pair RDLn because of the coupling with sense amplifier SAn is amplified by the preamplifier and the read data is taken out. The read data line pair RDLn corresponds to RDL127 on the representation of FIG. 1.

Data path 40 has a preamplifier 42 provided for each read data line pair. Each preamplifier operates in response to a preamplifier activating signal PAE generated by control circuit 30. Among a plurality of preamplifiers, a preamplifier corresponding to read data line pair RDLf is denoted by the reference character 42f, and the preamplifier corresponding to read data line pair RDLn is represented by the reference character 42n. The potential difference generated on read data line pair RDLf because of the coupling with sense amplifier SAf is amplified by preamplifier 42f, and the read data is taken out.

Data path 40 has an equalize/precharge circuit (not shown) provided for each read data line pair. Each equalize/precharge circuit operates in response to the read data line equalize signal RDLEQ generated by control circuit 30, and sets potential level of the corresponding read data line pair to a prescribed precharged potential.

Control circuit 30 includes a column predecode circuit 90 receiving a signal CDE controlling timing of activation of the column selection line and column address CA <3:0> and generating read predecode signals YAR <3:0> and YBR <3:0> (YARv <3:0> and YBRv <3:0> shown in FIG. 4). In accordance with the combination of signal levels of respective bits of the column address CA <3:0> of 4 bits, one column of memory cells is selected from sixteen columns of memory cells corresponding to one read data line pair RDL.

Read predecode signals YAR <3:0> and YBR <3:0> are set in accordance with information obtained by predecoding the column address CA <3:0> and control signal CDE defining the timing of activation of the column selection line.

Figure 5:
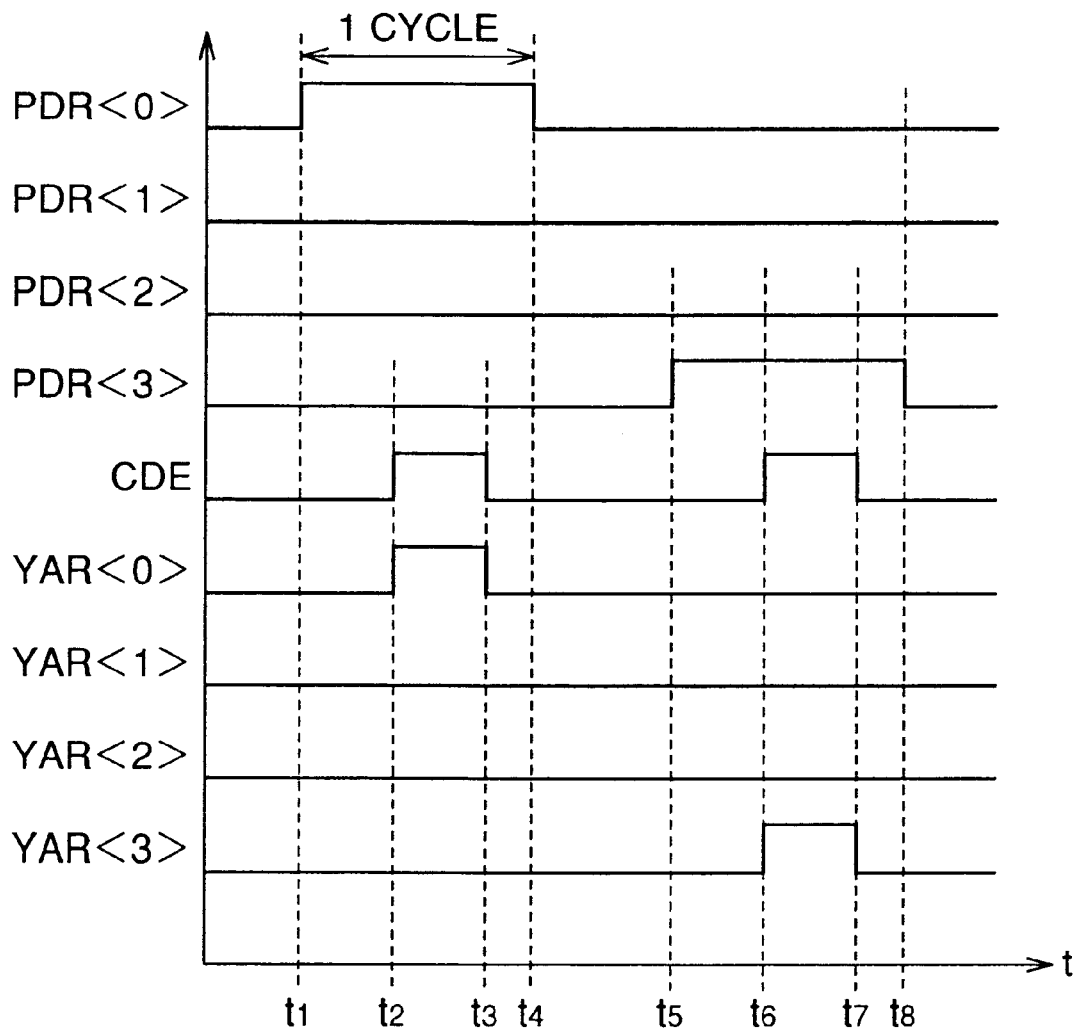
FIG. 5 is a timing chart related to generation of a read predecode signal.

FIG. 5 is a timing chart related to generation of the read predecode signal.

Referring to FIG. 5, generation of the read predecode signal YAR <3:0> for selecting a column of memory cells which is the object of the reading operation will be described. By predecoding two bits CA <1> and CA <0> of column address CA <3:0> input to column predecode circuit 90, signal bits PDR <0> to PDR <3> are obtained.

Referring to FIG. 5, at a time point t1 when one read cycle starts, the signal bit PDR <0> rises to the H (high) level in response to the column address. Activation of the signal bits PDR <0> to PDR <3> are maintained for one cycle period. In a period in which activation of the read column selection line is necessary in the read cycle, an activation timing control signal CDA designating this activation is rendered active from time point t2 to time point 3. In response to the signal bits PDR <3:0> and CDE, one bit of read predecode signal YAR <0> is kept active from t2 to t3. More specifically, the read predecode signal has both the information of the result of predecoding the column address and the information of the timing of activation of the column selection line.

At time t5 when the next reading operation starts, the signal bit PDR <3> is activated in accordance with the result of predecoding of the column address, and the active state is maintained for one read operation cycle period, that is, up to the time point t8. In the read operation cycle, the control signal CDE is activated between time points t6 and t7, and in this period, the corresponding bit of read predecode signal YAR <3> is activated.

Similarly, activation of read predecode signal YBR <3:0> is selectively executed in accordance with the result of predecoding of remaining two bits CA <3> and CA <2> of the column address and the control signal CDE.

Again referring to FIG. 4, in the DRAM macro in accordance with the first embodiment, the read column decode circuit 100 for selecting one of the plurality of memory cell columns corresponding to one same read data line pair is arranged on the opposite side of memory cell array to data path 40 where the preamplifier is arranged. Read column decode circuit 100 has a read column decoder 110 arranged for each column of memory cells.

Each read column decoder 110 generates a read column selection signal in response to read predecode signals YAR <3:0> and YBR <3:0>. The read column selection signal is transmitted to corresponding read gate by the read column selection line provided commonly to the sub row array.

In this manner, as the read column decoder and the preamplifier are arranged opposite to each other with the memory array placed therebetween, it becomes possible to transmit the read column selection signal at an earlier timing to the read gate corresponding to that sense amplifier which has large read data propagation delay on the read data line, that is, the sense amplifier which is at a relatively long distance from the preamplifier, for the sense amplifiers corresponding to the same read data line pair.

The read column selection signal for the sense amplifier SAn at the nearest point is generated by read column decoder 110n and transmitted over read column selection line CSLRn. Similarly, the read column selection signal for the sense amplifier SAf at the farthest point is generated by read column decoder 110f and transmitted over read column selection line CSLRf.

The read predecode signals YAR <3:0> and YBR <3:0> generated by column predecode circuit 90 in control circuit 30 are first transmitted to buffer circuit 80 as YARv <3:0> and YBRv <3:0> in a direction along the column direction of the memory cells. Buffer circuit 80 receives the read predecode signals, and transmits the received signals as signals YARh <3:0> and YBRh <3:0> in the row direction of the memory cells, to each read column decoder 110 in read column decode circuit 100.

The signals YARh <3:0> and YARv <3:0> are the same as the read predecode signal YAR <3:0>. Suffixes "h" and "v" are added in order to distinguish the direction of propagation over the signal lines. The same applies to the signals YBRh <3:0> and YBRv <3:0>. In the following description also, the control signal with suffix "h" represents the signal propagated in the row direction of the memory cell (horizontal direction), and the signal with suffix "v" represents a signal propagated in the column direction of the memory cells (vertical direction).

By this configuration, the direction of propagation of the read predecode signals YARh <3:0> and YBRh <3:0> for read column decoders 110 can be made the same as the propagating direction of preamplifier activating signal PAE.

Figure 6:
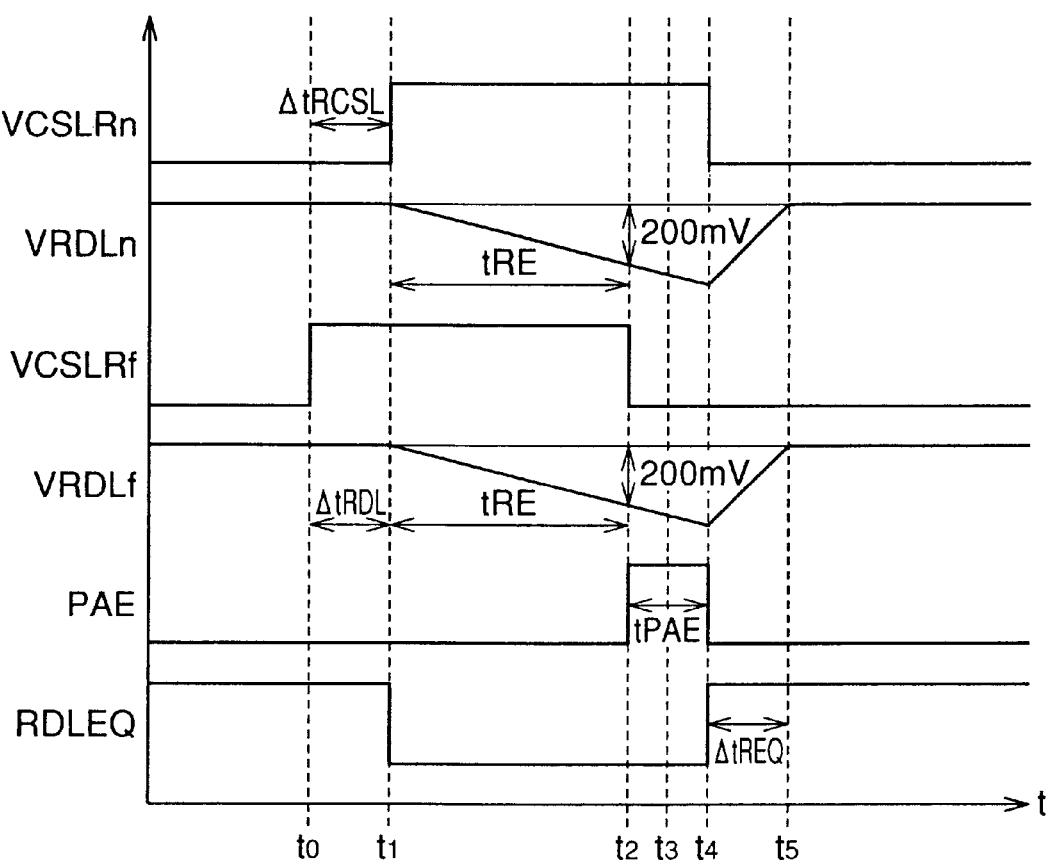
FIG. 6 is a timing chart related to the reading operation in the DRAM macro in accordance with the first embodiment.

FIG. 6 is a timing chart related to the reading operation in the DRAM macro in accordance with the first embodiment.

Referring to FIG. 6, VCSLRn represents variation in potential level of the read column selection line CSLRn at the position of sense amplifier SAn at the nearest point, and VRDLn represents variation in potential difference generated on read data line pair RDLn at the position of preamplifier 42n. Similarly, VCSLRf represents variation in potential level of read column selection line CSLRf at the position of sense amplifier SAf at the farthest point, and VRDLf represents variation in potential difference generated on read data line pair RDLf at the position of preamplifier 42f. PAE and RDLEQ represent timings of activating preamplifier activating signal and read data line equalize signal, respectively.

As described with reference to FIG. 4, the preamplifier activating signal PAE, the read data line equalize signal RDLEQ and the read predecode signals YARh <3:0> and YBRh <3:0> transmitted to the read column decoder are propagated in the same direction over the signal lines of the same line length. Therefore, assuming that experienced line delays $\Delta tPAE$, $\Delta tREQ$ and $\Delta tYRh$ are the same, the timing of change in the potential level of the read data line pair corresponding to these control signals can be considered relatively the same regardless of the distance between the sense amplifier and the control circuit, when the positions of respective preamplifiers are used as the reference.

In FIG. 6, VCSLRn and VRDLn represent variations in potential after the reference time point t0 when read column decoder 110n outputs the read column selection signal for reading data of sense amplifier SAn to column selection line CSLRn. VCSLRf and VRDLf represent variations in potential after the reference time point t0 when the corresponding read column decoder 110f outputs the read column selection signal for reading data of sense amplifier SAf to column selection line CSLRf.

By the time t1 when the read column selection signal is output to the read column selection line CSLRn, the precharge/equalize operation for each read data line pair is completed, and read data line equalize signal RDLEQ is inactivated.

Though read column decoder 110n generates the read column selection signal at time t0, there is a line delay $\Delta tRCSL$ before the signal is transmitted to the position of sense amplifier SAn, and therefore it is from the time point t1 that the potential difference appears on read data line pair RDLn.

At time t0, read column decoder 110f also generates the read column selection signal. Sense amplifier SAf is provided close to read column decoder 110f. Therefore, VCSLRf starts to change from time t0. However, the potential difference transmitted from sense amplifier SAf to read data line pair RDLf requires the line delay $\Delta tRDL$ before it reaches the position of preamplifier 42f. Therefore, it is from the time point t1 that the potential difference appears on read data line pair RDLf at preamplifier 42f. In FIG. 6, the line lengths of read column selection lines CSLRn, CSLRf and read data line pairs RDLf and RDLn, and therefore the line delays, are represented as equal to each other.

From time t1, potential difference on read data line pairs appears both at preamplifiers 42n and 42f. After the lapse of time tRE, that is, at time point t2, VRDLn and VRDLf reach the preamplifier sensitivity (200 mV in FIG. 6). At time t2, preamplifier activating signal PAE is activated, and potential difference on the read data line pairs is established at time point 4 after the lapse of tPAE. Here, the time tPAE is defined as the preamplifier active period necessary for the read data to be established after activation of the preamplifier.

At time t4 when the read data is established, the read data line equalize signal RDLEQ is activated for initializing the read data line pair of the precharge potential, and at time t5 after the lapse of time $\Delta tREQ$, initialization of the read data lines is completed. Here, $\Delta tREQ$ is defined as the equalize period necessary for initializing the read data line pair to the precharge potential.

In the reading operation in the DRAM macro in accordance with the first embodiment, the read column decoder and the preamplifier are arranged opposite to each other with the memory array placed therebetween. Therefore, the propagation direction of the read column selection signal on the read column selection line and the direction of propagation of the read data transmitted from the sense amplifier on the read data line can be made equal to each other.

Figure 22:
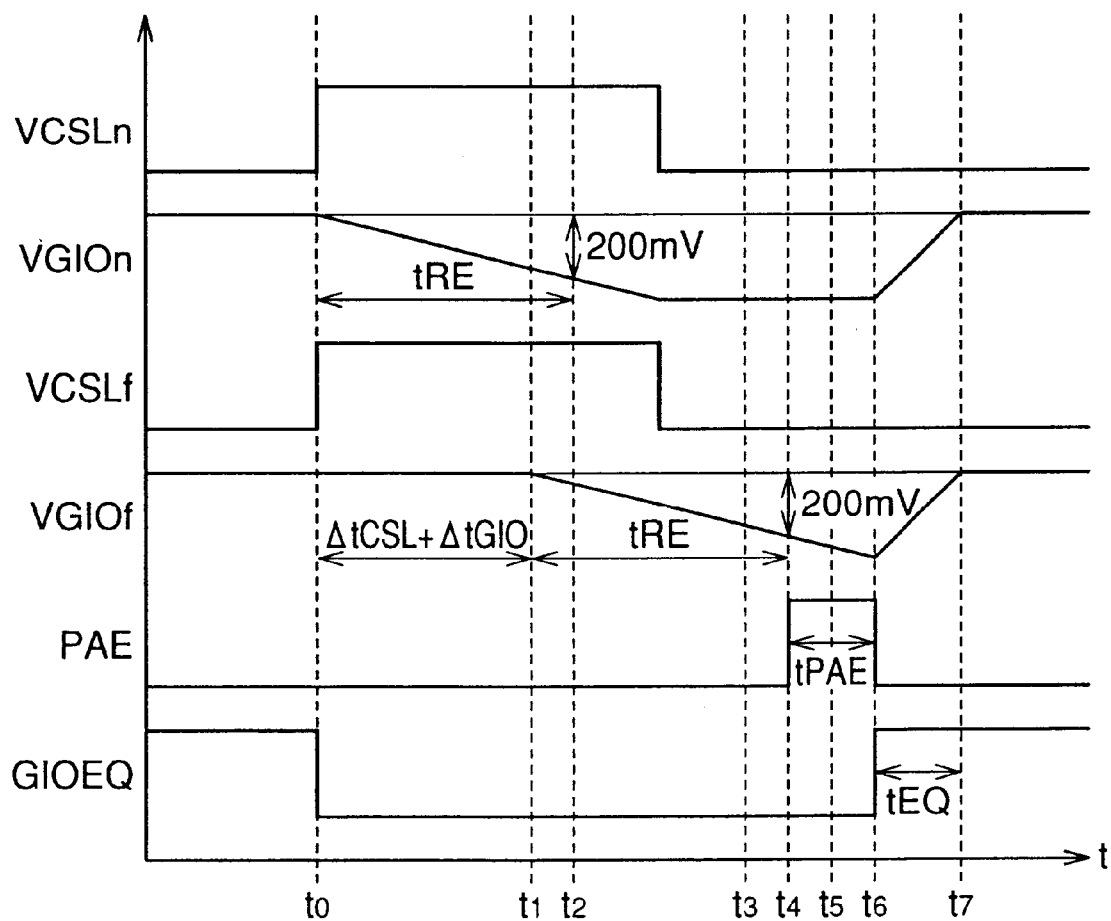
FIG. 22 is a timing chart representing problems in the reading operation of the conventional DRAM macro.

Therefore, regardless of the position of the sense amplifier, the timings of transmitting data on the read data line pair for respective control signals can be made equal to each other, when the position of the preamplifier is used as the reference. Assuming that read cycles continue, a state where appearance of the read data of the next cycle starts at time t5 on FIG. 6 when equalization ends can be defined as the minimum operation cycle. Thus, the minimum cycle time is tRE+tPAE+tREQ. As compared with the minimum cycle time described with reference to FIG. 22, the influence of propagation delay of signals over the lines transmitting the read data and the column selection line on the minimum cycle time can be eliminated, and therefore the speed of operation can be increased, by the reduction of the minimum operation cycle time.

Modification of the First Embodiment

Figure 7:
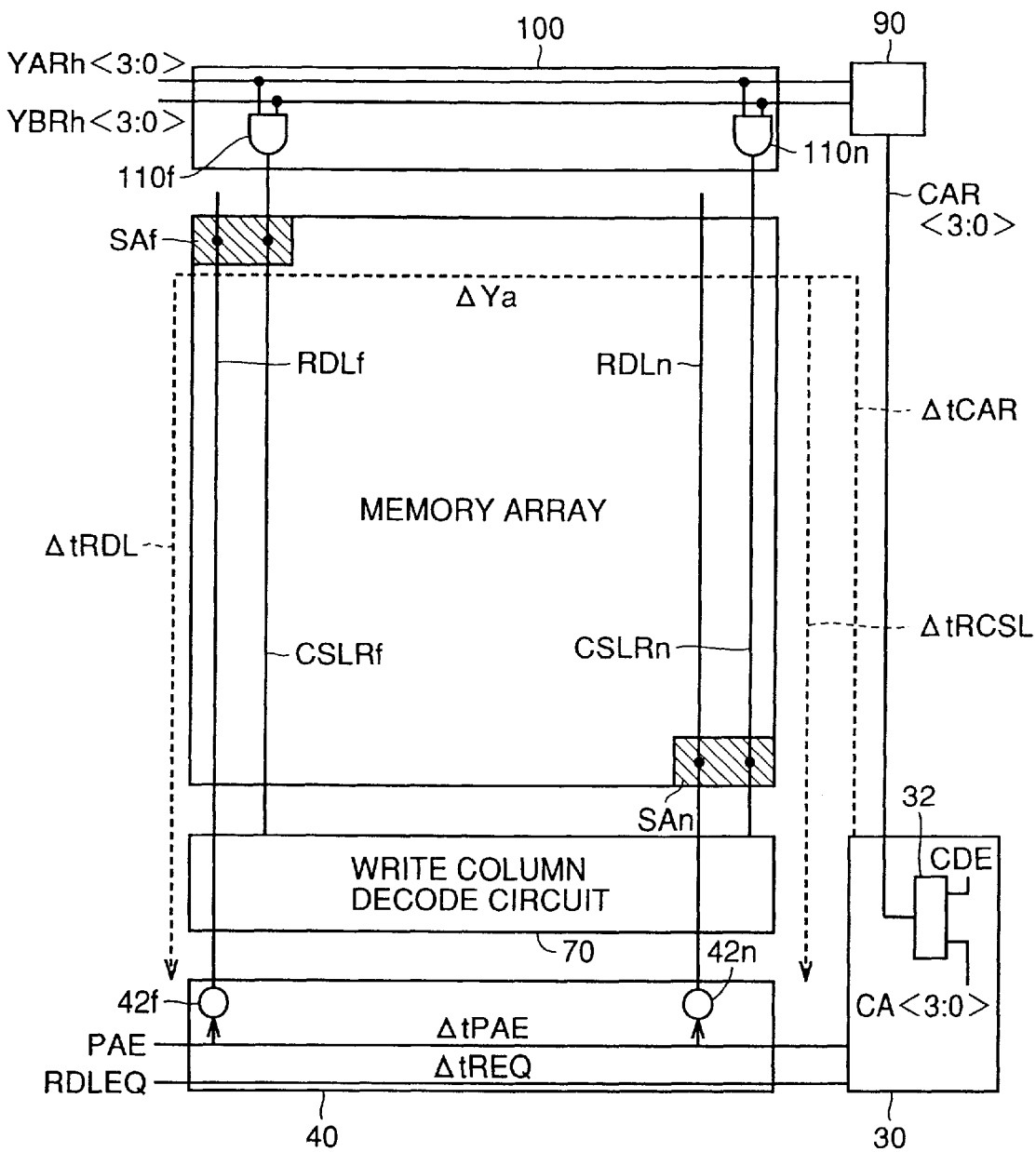
FIG. 7 is a block diagram representing circuit arrangement and flow of control signals related to the reading operation in the DRAM macro in accordance with a modification of the first embodiment.

FIG. 7 is a block diagram representing circuit arrangement and the flow of control signals related to the reading operation in the DRAM macro in accordance with a modification of the first embodiment.

Referring to FIG. 7, the DRAM macro in accordance with the modification of the first embodiment differs from the DRAM macro described with reference to FIG. 4 in that column predecode circuit 90 is not provided in control circuit 30 but provided in an area adjacent to read column decode circuit 100, in place of buffer circuit 80.

Control circuit 30 generates, by means of signal generating circuit 32, a signal CAR <3:0> which is provided as a logical product of activation timing control signal CDE for the read column selection line and the column address CA <3:0>.

The column predecode circuit 90 generates read predecode signals YARh <3:0> and YBRh <3:0> which are similar to those of FIG. 4, upon reception of the signal CAR <3:0>. Read column decoder 110 in read column decode circuit 100 outputs the read column selection signal to the corresponding read column selection line, in response to these read predecode signals.

In the first embodiment described with reference to FIG. 4, a total of eight bits of signals including read predecode signals YARv <3:0> and YBRv <3:0> are transmitted between control circuit 30 and buffer circuit 80, while in the configuration of FIG. 7, only four bits of signal CAR <3:0> are transmitted between column predecode circuit 90, which is provided in place of buffer circuit 80 and control circuit 30.

In the DRAM macro in accordance with the modification of the first embodiment, the number of signal lines arranged along the column direction from control circuit 30 can be reduced, and therefore, the chip area can be saved.

The timings of operation of various circuits after the output of the read column selection signals from the read column decoders are the same as those described in the first embodiment, and therefore, description thereof is not repeated.

Second Embodiment

Figure 8:
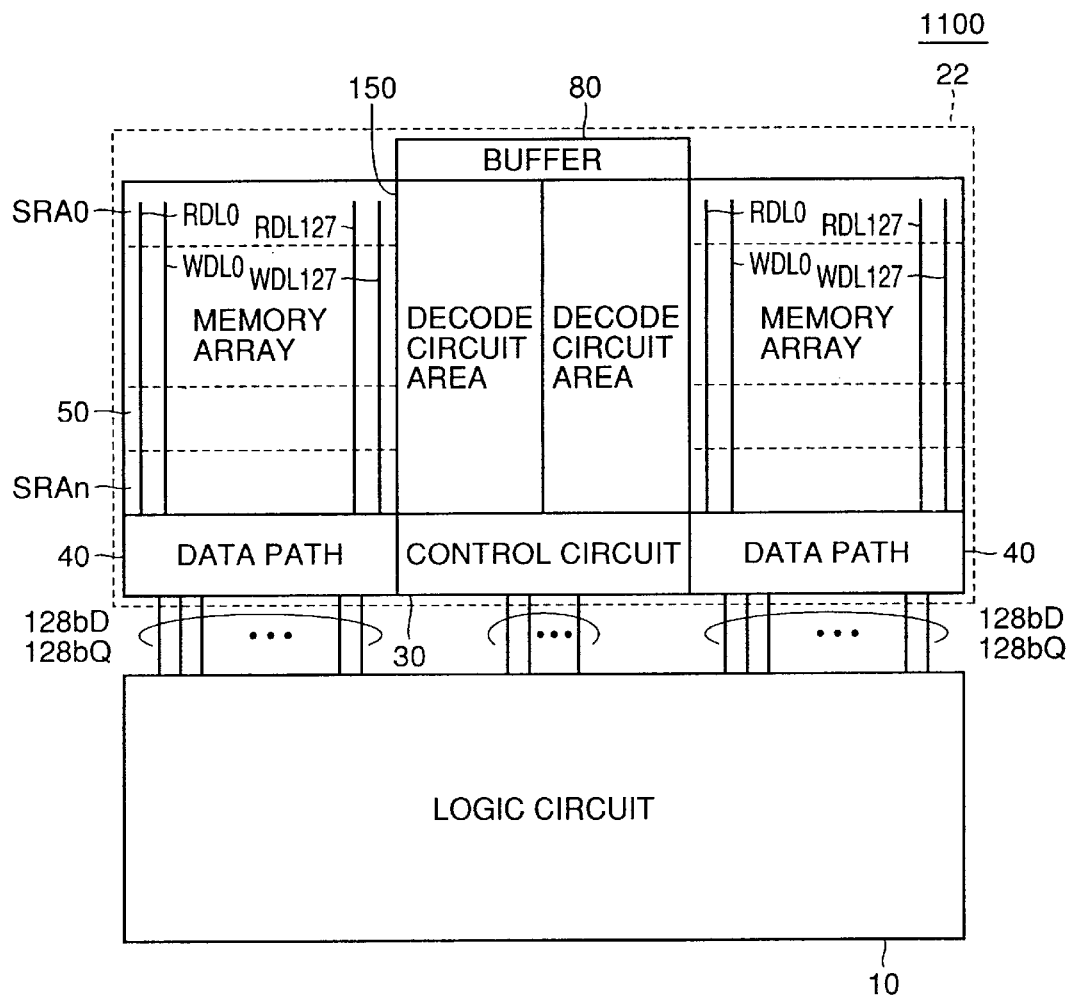
FIG. 8 is a schematic block diagram representing an over all configuration of a DRAM embedded system LSI 1100 in accordance with a second embodiment of the present invention.

FIG. 8 is a schematic block diagram of the DRAM embedded system LSI 1100 in accordance with the second embodiment of the present invention.

Referring to FIG. 8, DRAM embedded system LSI 1100 includes a logic circuit 10 and a DRAM macro 22. DRAM macro 22 differs from DRAM macro 20 in accordance with the first embodiment in the area of arrangement of the column decode circuit. More specifically, as can be seen from FIG. 1, DRAM macro 20 has write column decode circuit 70 and read column decode circuit 100 opposite to each other with the memory array placed therebetween, in an area adjacent to the memory array in the column direction, whereas in DRAM macro 22, the column decode circuits are provided in the same area as row decoder. In FIG. 8, an area in which these decode circuits are provided is represented as decode circuit area 150. In accordance with the arrangement of the column decode circuit, different from the first embodiment, the read/write column selection line is provided in the row direction of the memory cells.

Except these points, the circuit configuration is the same as that of DRAM macro 20 shown in FIG. 1, and therefore, description thereof is not repeated.

Figure 9:
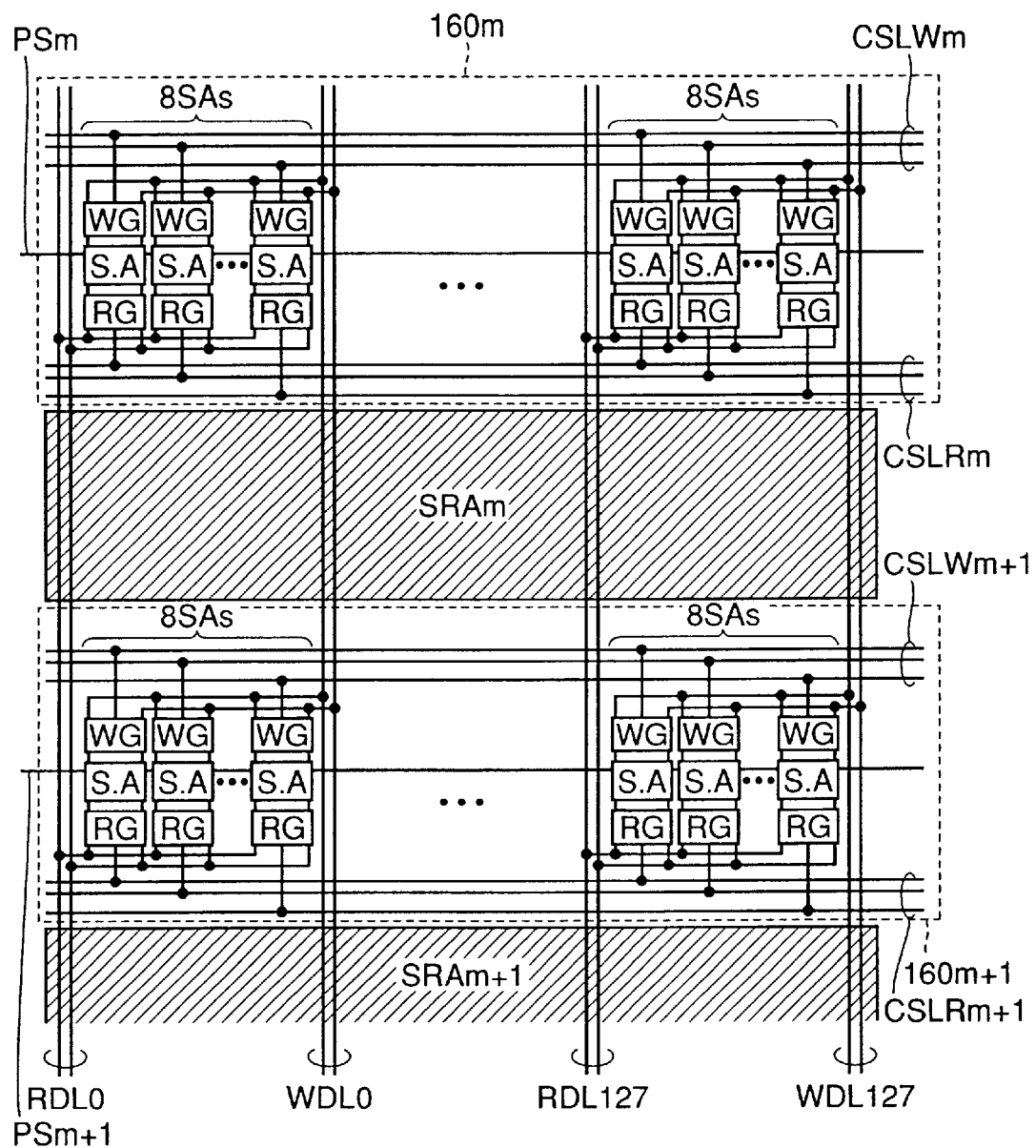
FIG. 9 is a schematic diagram representing arrangement of sense amplifiers in the memory array of a DRAM macro in accordance with the second embodiment.

FIG. 9 is a schematic diagram representing arrangement of sense amplifiers in the memory array of DRAM macro in accordance with the second embodiment.

In FIG. 9, again an example is shown in which read data line pair RDL and write data line pair WDL are arranged at every sixteen columns of memory cells. Since sense amplifier SA is provided corresponding to each column of memory cells for each sub row array, sixteen sense amplifiers provided corresponding to a sub row array SRAm (m: integer from 0 to n) are selectively coupled to a set of data line pairs RDL and WDL.

The sense amplifiers corresponding to one sub row array SRAm are arranged divided on upper and lower adjacent areas (hereinafter also referred to as sense amplifier stages) 160m and 160m+1 of the sub row array. Driving power supply is provided by power supply line PSm to the sense amplifier group in sense amplifier stage 160m, and driving power supply is provided by a separate power supply line PSm+1 to the sense amplifier group in the sense amplifier stage 160m+1. The configurations of read gate RG and write gate WG and the manner of connection between sense amplifiers SA and respective data lines are the same as those described with reference to FIG. 3. Therefore, description thereof is not repeated.

On the memory array, read data line pairs RDL0 to RDL127 and write data line pairs WLDL0 to WDL127 are arranged. One read data line pair RDL and write data line pair WDL can be connected to eight sense amplifiers in each sense amplifier stage, and in each sub row array, selectively coupled to sixteen sense amplifiers through read gate RG and write gate WG.

When sub row array SRAm is selected, sense amplifier stages 160m and 160m+1 positioned above and below the sub row array are activated, and by column selection lines CSLRm, CSLRm+1, CSLWm and CSLWm+1 arranged extending in the row direction, read gate RG and write gate WG are selectively activated, so that corresponding sense amplifiers are connected to the read data line pair RDL or write data line pair WDL.

In the memory array of the DRAM macro in accordance with the second embodiment, two sense amplifiers corresponding to continuous memory cell columns are arranged to belong to opposite sense amplifier stages with the sub row array positioned therebetween. For example, sense amplifiers corresponding to even-numbered column addresses are arranged in sense amplifier stage 160m on the upper area of sub row array, while sense amplifiers corresponding to odd-numbered column addresses are arranged in sense amplifier stage 160m+1 in the lower area of the sub row area.

Accordingly, when the column address is even-numbered, one of the eight sense amplifiers arranged in the upper area 160m of the sub row array is selected by column selection line CSLRm or CSLWm, and selectively coupled to the read data line pair or write data line pair. Similarly, when the column address is odd-numbered, one of eight sense amplifiers arranged on the lower area 160m+1 of the sub row array is selected by column selection line CSLRm+1 or CSLWm+1 and selectively coupled to the read data line pair or write data line pair.

Generally, column access in the memory array takes place in accordance with column addresses incremented in order. Therefore, by the configuration shown in FIG. 9, concentration of load on one power supply line, as experienced when a group of sense amplifiers fed by the same power supply line are activated continuously, can be prevented.

Figure 10:
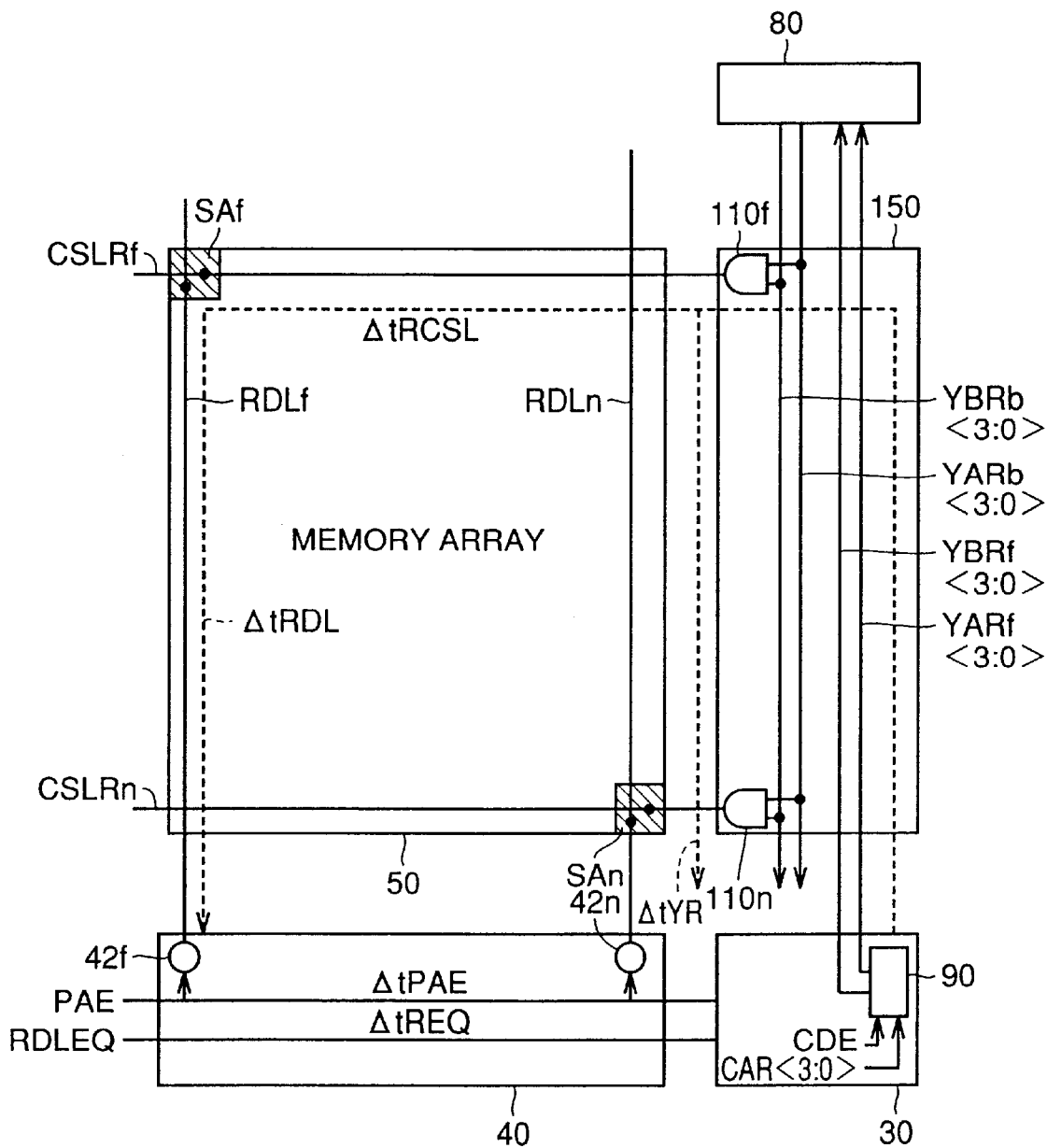
FIG. 10 is a block diagram representing circuit arrangement and flow of control signals related to the reading operation in the DRAM macro in accordance with the second embodiment.

FIG. 10 is a block diagram representing circuit arrangement and the flow of control signals related to the reading operation in the DRAM macro in accordance with the second embodiment.

Referring to FIG. 10, control circuit 30 generates, in the similar manner as in the first embodiment, read predecode signals YAR <3:0> and YBR <3:0>. The generated read predecode signals are transmitted as YARf <3:0> and YBRf <3:0> from control circuit 30 to buffer circuit 80. Buffer circuit 80 returns YARf <3:0> and YBRf <3:0> and outputs YARb <3:0>πand YBRb <3:0>. Here, YARf <3:0> and YARb <3:0> are the same as read predecode signal YAR <3:0>. Suffixes "f" and "b" are added to distinguish the direction of propagation over signal lines. The same applies to YBRf <3:0> and YBRb <3:0>. In the following description, a control signal with suffix "f" represents a signal propagated along the column direction (vertical direction) of the memory cells from the control circuit 30 to buffer circuit 80 (from the bottom to the top in the figure), while a control signal with suffix "b" represents the signal propagated in the opposite direction.

A read column decoder 110 is arranged in decode circuit area 150. Read column decoder 110 is provided in each sub row array, and in response to read predecode signals YAR <3:0> and YBR <3:0>, generates a read column selection signal for selecting one column from sixteen columns of memory cells corresponding to the read data line pair RDL. The read column selection signal is transmitted to each corresponding read gate by the read column selection line. As described with reference to FIG. 9, the read column selection line selectively activates read gate RG arranged between the read data line pair and the sense amplifiers in the sense amplifier stages arranged in the upper and lower areas of the corresponding sub row array, and transmits the read data amplified by the sense amplifier to the read data line pair.

Each read column decoder 110 receives read predecode signals YARb <3:0> and YBRb <3:0> from buffer circuit 80 and activates the corresponding read column selection line.

In FIG. 10, as in FIG. 4, the difference in timings of reading operations for the sense amplifier SAf at the farthest point and the sense amplifier SAn at the nearest point will be considered. The read column selection line CSLRf provided corresponding to the sense amplifier SAf at the farthest point is activated by read column decoder 110f, and read column selection line CSLRn provided corresponding to sense amplifier SAn at the nearest point is activated by read column decoder 110n. In the decode circuit area 150, the read predecode signal is once returned by buffer circuit 80 and transmitted to each read column decoder. Therefore, the read predecode signal is transmitted starting from the read column decoder 110f corresponding to sense amplifier SAf at the farthest point. More specifically, for the group of sense amplifiers corresponding to the same read data line pair, it is possible to transmit the read column selection signal at an earlier timing to the read gate corresponding to the sense amplifier having largest read data propagation delay on the read data line, that is, to the read gate which is at a relatively long distance from the preamplifier.

Therefore, in the DRAM macro in accordance with the second embodiment shown in FIG. 10, the propagation direction of the read data transmitted from the sense amplifier on the read data line and the propagation direction of the read predecode signal can be made equal to each other. Also, the line delay ΔtRDL on the read data line pair for the sense amplifier SAf at the farthest point and the delay time ΔtYR of the read predecode signal transmitted to the sense amplifier SAn at line and receives the predecode signals from the third signal lines. Therefore, as in the first embodiment, regardless of the position of the sense amplifiers, the timings of transmitting data on the read data line pair for the control signals can be made equal to each other when the position of the preamplifiers is used as the reference. Therefore, the influence of line delay over the line transmitting the read data and over the column selection lines on the minimum operation cycle time in the reading operation can be eliminated. Therefore, the speed of operation can be increased by the reduction of minimum operation cycle time.

First Modification of the Second Embodiment

Figure 11:
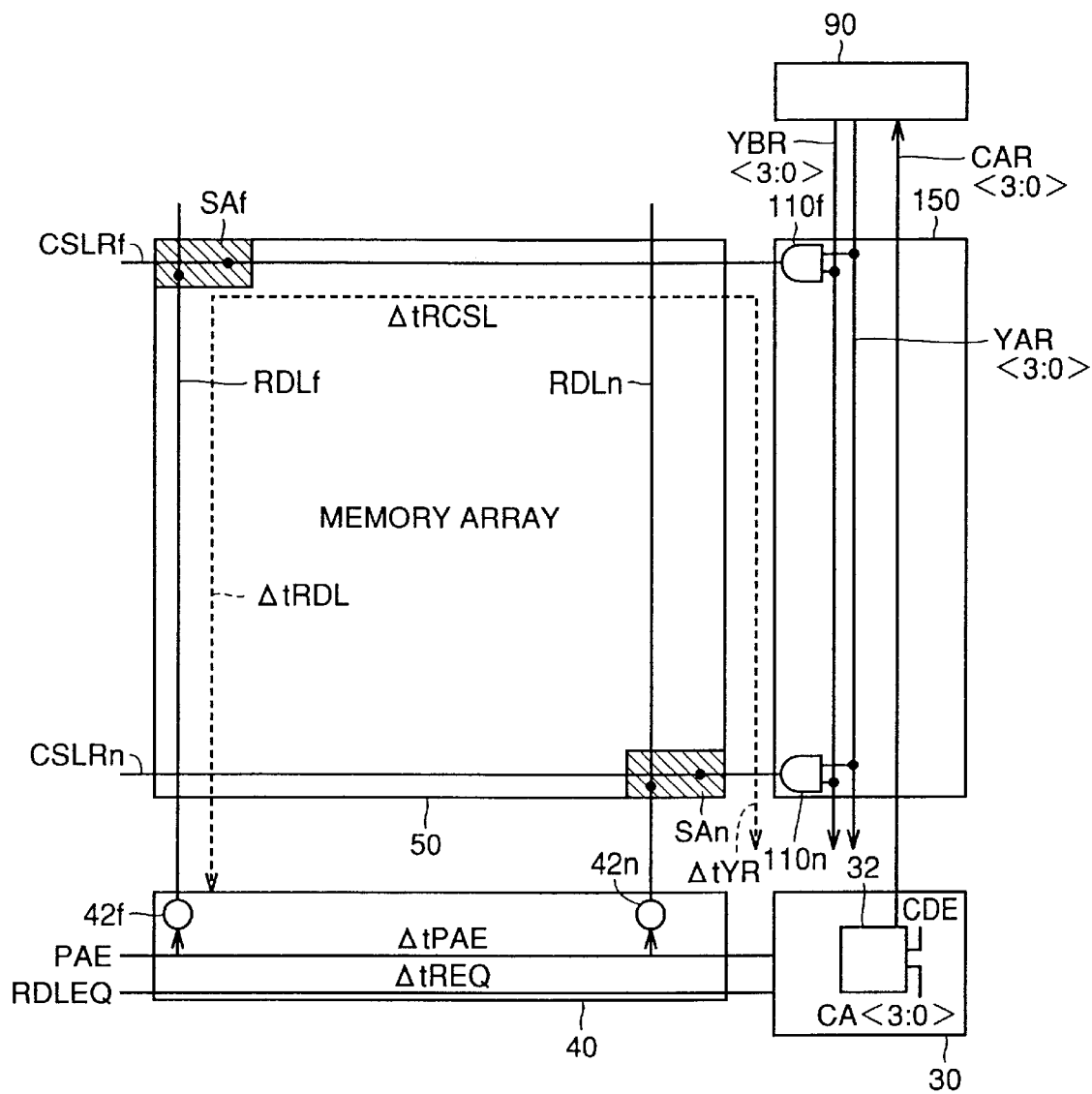
FIG. 11 is a block diagram representing circuit arrangement and flow of control signals related to the reading operation in the DRAM macro in accordance with a first modification of the second embodiment.

FIG. 11 is a block diagram representing circuit arrangement and the flow of control signals related to the reading operation in the DRAM macro in accordance with a first modification of the second embodiment.

Referring to FIG. 11, the first modification of the second embodiment is characterized in that column predecode circuit 90 which has been provided in control circuit 30 in the second embodiment is arranged opposite to control circuit 30 with decode circuit area 150 placed therebetween, in place of buffer circuit 80.

Control circuit 30 generates, through signal generating circuit 32, a signal CAR <3:0> obtained by logical product of an activation timing control signal CDE of the read column selection line and column address CA <3:0>.

Column predecode circuit 90 receives the signal CAR <3:0> and generates read predecode signals YAR <3:0> and YBR <3:0> similar to those of FIG. 4. In response to these read predecode signals, each read column decoder 110 outputs a read column selection signal to the corresponding read column selection line.

In the second embodiment described with reference to FIG. 10, a total of eight bits of signals, that is, read predecode signals YARf <3:0> and YBRf <3:0> are transmitted between control circuit 30 and buffer circuit 80, whereas in the configuration of FIG. 11, the signal CAR <3:0> of four bits is transmitted between control circuit 30 and column predecode circuit 90 arranged in place of buffer circuit 80. Operation timings of various circuits after the read column selection signal is output from each column decoder are the same as those described with reference to the second embodiment. Therefore, description thereof is not repeated.

In this manner, in the DRAM macro in accordance with the first modification of the second embodiment, the number of signal lines arranged along the column direction can be reduced, and hence the chip area can be reduced.

Second Modification of the Second Embodiment

Figure 12:
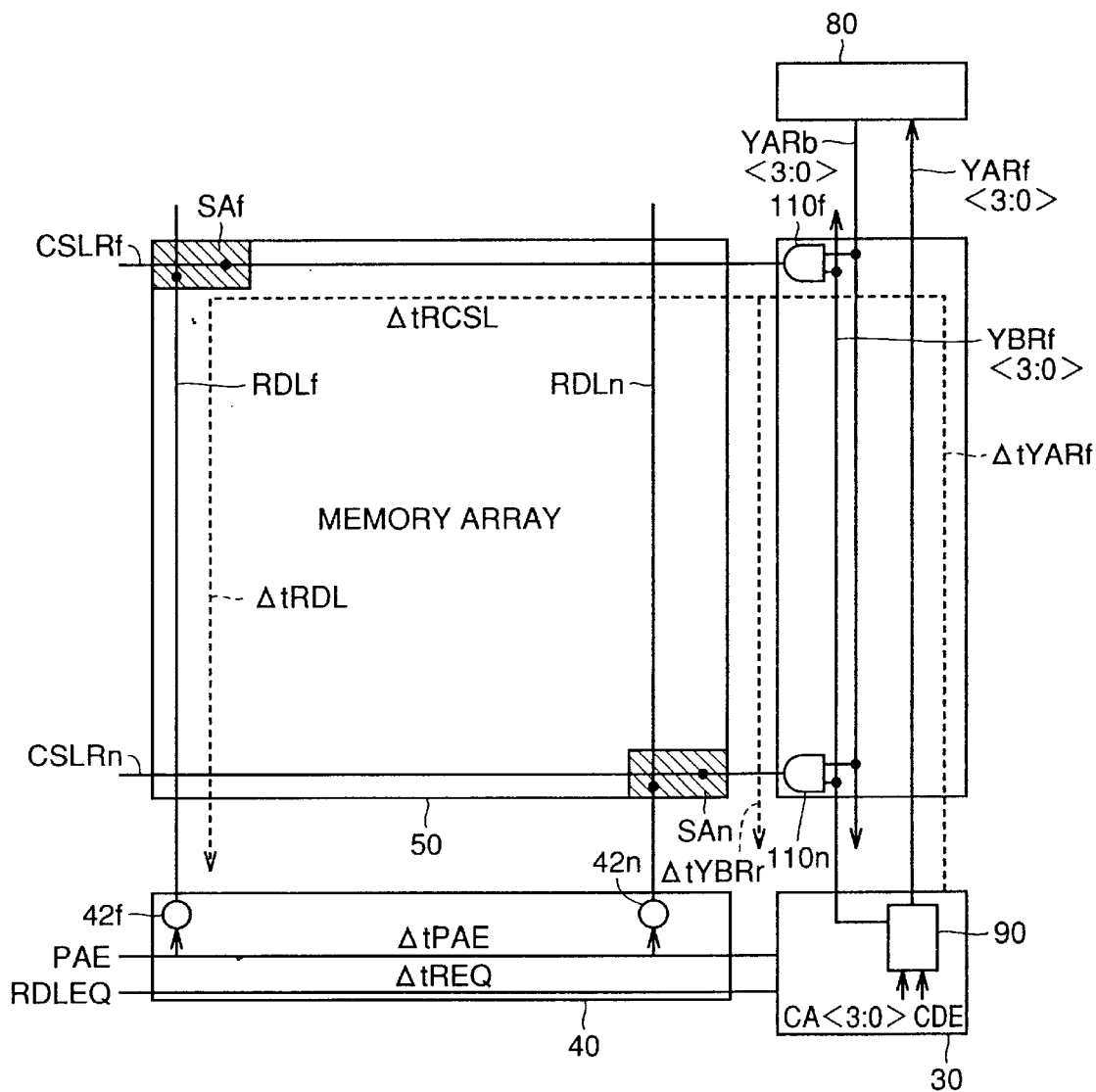
FIG. 12 is a block diagram representing circuit arrangement and flow of control signals related to the reading operation in the DRAM macro in accordance with a second modification of the second embodiment.

FIG. 12 is a block diagram representing circuit arrangement and the flow of control signals related to the reading operation of the DRAM macro in accordance with the second modification of the second embodiment.

Referring to FIG. 12, control circuit 30 includes a column predecode circuit 90. Column predecode circuit 90 receives activation timing control signal CDE for the read column selection line and column address CA <3:0>, and generates read predecode signals YAR <3:0> and YBR <3:0>.

In the second modification of the second embodiment, only four bits of the read predecode signals are generated as a signal reflecting the activation timing designated by control signal CDE, and the other four bits generated as a signal for maintaining active state for one cycle.

Figure 13:
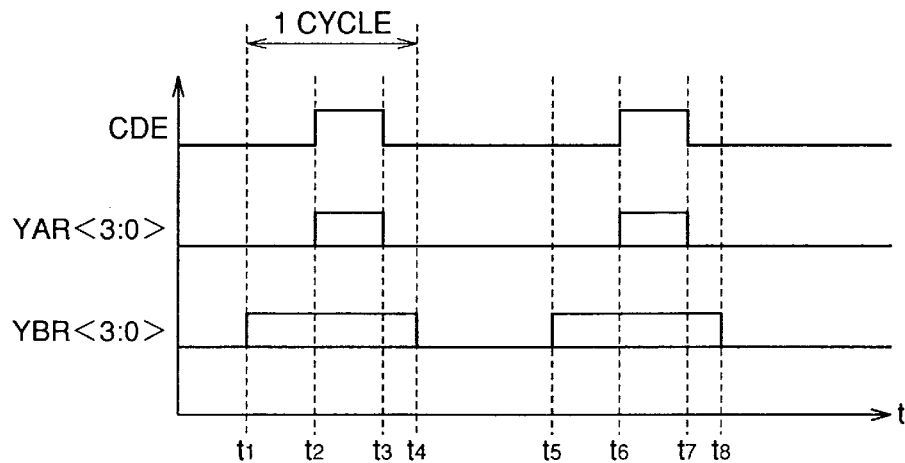
FIG. 13 is a diagram of waveforms representing timings of activation of the read predecode signals in the second modification of the second embodiment.

FIG. 13 is a diagram of waveforms representing activation timings of respective read predecode signals in the second modification of the second embodiment.

In FIG. 13, read predecode signal YAR <3:0> is the signal obtained as a result of logical product of the result of predecoding the column address and the control signal CDE, and it is activated between the time points t2 to t3 and t6 to t7. The signal YBR <3:0> is generated as a signal not reflecting the active period of the column selection line but as a signal for maintaining activation for one cycle (between time points t1 to t4 and t5 to t8).

Again referring to FIG. 12, the read predecode signal generated as YARf <3:0> from control circuit 30 is returned by buffer circuit 80, and transmitted as YARb <3:0> to each predecoder 110. The signal YBR <3:0> which is a signal not reflecting the activation timing of the column selection line is directly transmitted to each read column decoder 110 by control circuit 30 as YBRf <3:0>. The timings of operation of various circuits after the read column selection signal is output by each column decoder are the same as those described with reference to the second embodiment. Therefore, description thereof is not repeated.

In this configuration also, the timing of activation of the column selection line corresponding to each predecoder is similar to that of the second embodiment described with reference to FIG. 10. In the configuration of FIG. 12, the signal to be returned by buffer circuit 80 is only one part of read predecode signals YAR <3:0> and YBR <3:0>, and therefore the number of signal lines arranged along the column direction can be reduced as in the first modification of the second embodiment described with reference to FIG. 11, and hence the chip area can be reduced.

Third Modification of the Second Embodiment

Figure 14:
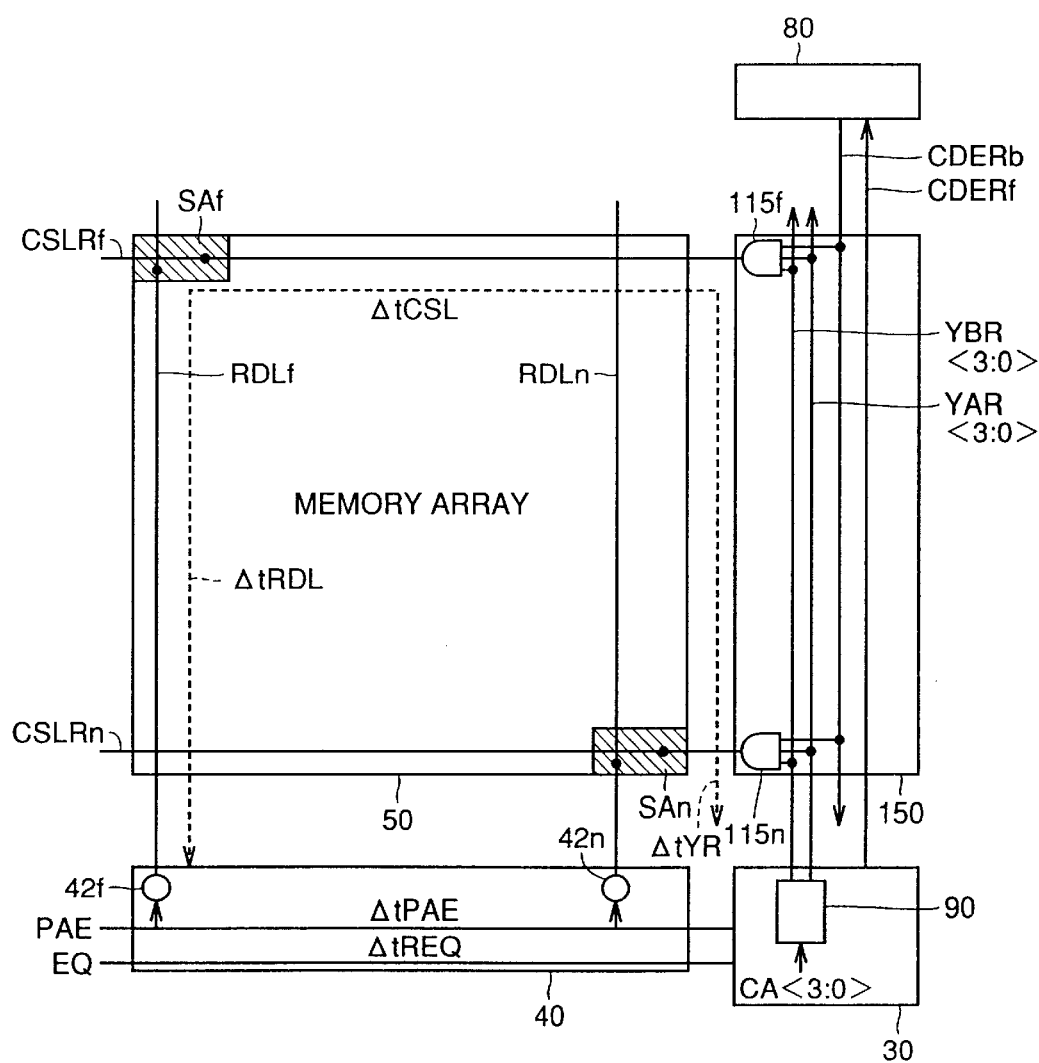
FIG. 14 is a block diagram representing circuit arrangement and flow of control signals related to the reading operation in the DRAM macro in accordance with a third modification of the second embodiment.

FIG. 14 is a block diagram representing circuit arrangement and the flow of control signals related to the reading operation in the DRAM macro in accordance with the third modification of the second embodiment.

Referring to FIG. 14, in the third modification of the second embodiment, control circuit 30 includes a column predecode circuit 90. Column predecode circuit 90 receives column address CA <3:0> and generates read predecode signals YAR <3:0> and YBR <3:0>. The information of the activation timing control signal CDE for the read column selection line is not reflected on these read predecode signals.

Figure 15:
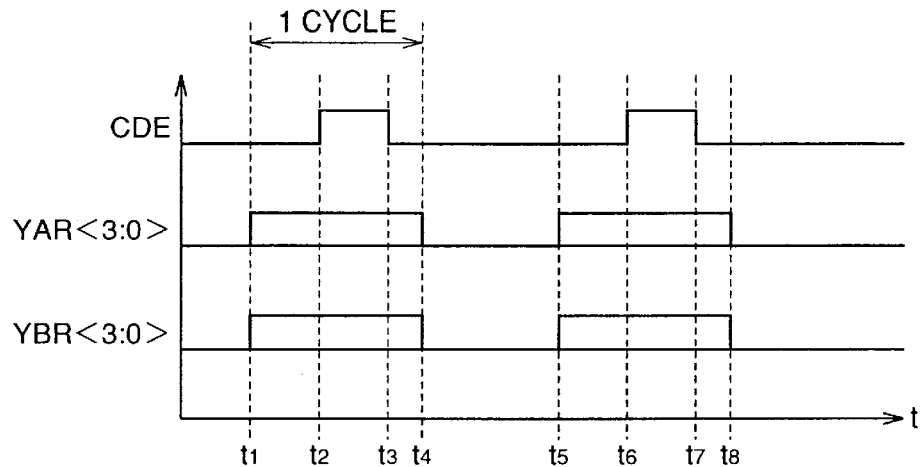
FIG. 15 is a diagram of signal waveforms representing timings of activating read predecode signals in the third modification of the second embodiment.

FIG. 15 is a diagram of waveforms representing activation timings of the read predecode signals in the third modification of the second embodiment.

Referring to FIG. 15, in the third modification of the second embodiment, read predecode signals YAR <3:0> and YBR <3:0> are generated as signals not reflecting the information related to the activation timing of the column selection line but as signals maintaining the active state for one cycle of the reading operation (between time point t1 to t4 and t5 to t8). The activation timing control signal CDE is applied to each column decoder independent from the read predecode signals, as a signal which is activated in a certain period (between time points t2 to t3 and t6 to t7) of the read cycle in which the read column selection line is to be activated.

Again referring to FIG. 14, control circuit 30 outputs the activation timing control signal CDE for the read column selection line. The output control signal CDE is transmitted as a signal CDERf to buffer circuit 80. The activation timing control signal returned by buffer circuit 80 is transmitted as a signal CDERb to each read column decoder 115. Each read column decoder 115 receives read predecode signals YAR <3:0> and YBR <3:0> as well as the control signal CDERb, and activates the corresponding column selection line.

Each read column decoder 115, having received the read predecode signals YAR <3:0> and YBR <3:0> in advance, outputs the read column selection signal to activate the corresponding column selection line CSLR, in response to propagation of the activation timing control signal CDERb for the column selection line, generated by buffer circuit 80.

Therefore, the read column decoders 115 are activated in an order starting from read column decoder 115f corresponding to sense amplifier SAf at the farthest point, and read column selection line CSLRn is activated by read column decoder 115n after the lapse of $\Delta tYR$ from the activation of read column selection line CSLRf. Therefore, by the configuration of FIG. 14 also, as the line delay $\Delta tRDL$ experienced on the read data line pair and the line delay $\Delta tYR$ experienced in propagating the control signal are in the same direction, the activation timing of the column selection lines corresponding to respective predecoders is the same as the second embodiment described with reference to FIG. 10. Operation timings of various circuits after the read column selection signal is output from each read column decoder are the same as those of the second embodiment, and therefore description thereof is not repeated.

In the configuration shown in FIG. 14, the signal to be returned by buffer circuit 80 is only the activation timing control signal CDE. Therefore, as compared with the first and second modifications of the second embodiment, the number of signal lines arranged along the column direction can further be reduced, and the chip area can be reduced.

Further, as the read predecoder signal is separated from the activation timing control signal for the column selection line, it becomes possible to share the read predecode signal with the write column decoder arranged in the same area. Thus, the number of lines provided in the decoder circuit area 150 can further be reduced, and the chip area can be reduced.

Third Embodiment

Figure 16:
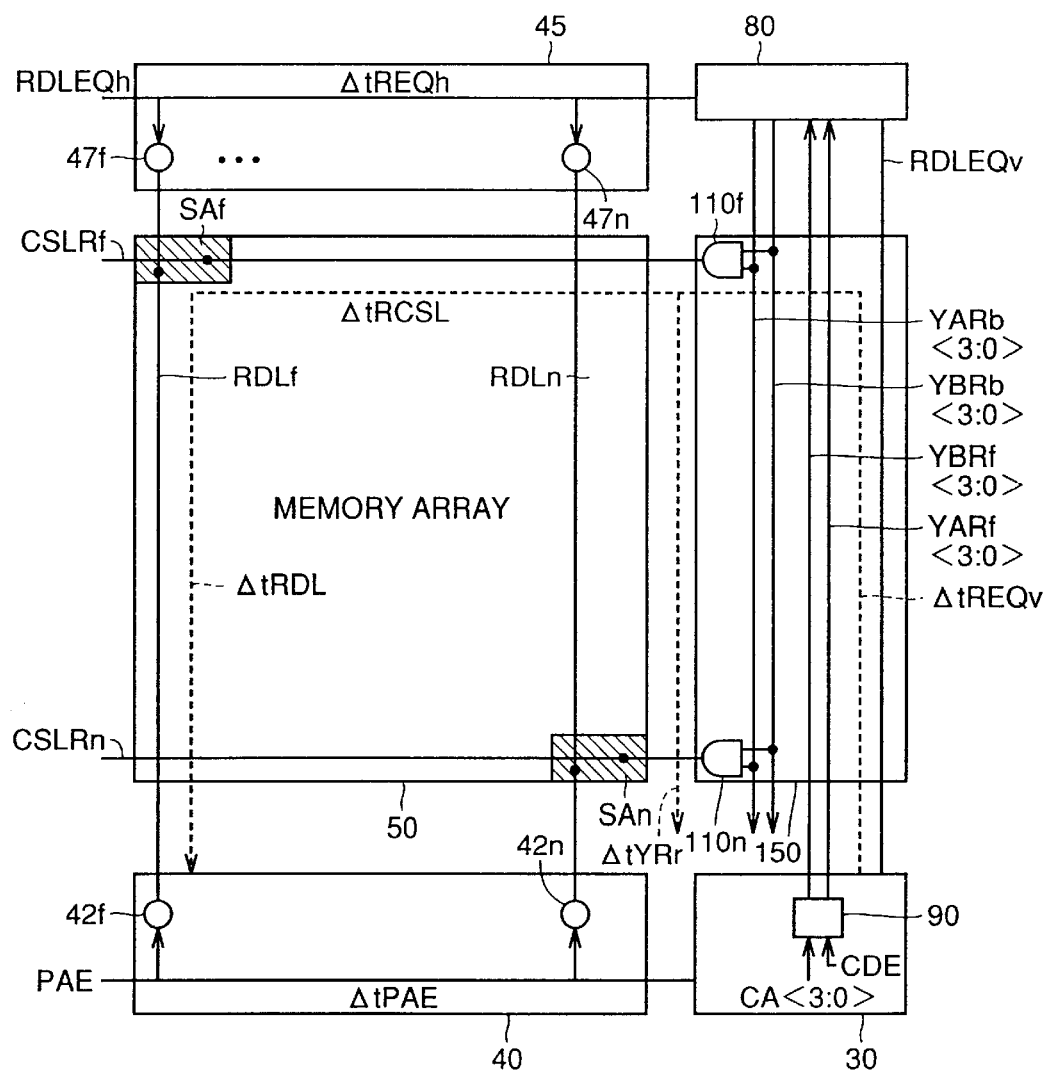
FIG. 16 is a block diagram representing circuit arrangement and flow of control signals related to the reading operation in the DRAM macro in accordance with a third embodiment.

FIG. 16 is a block diagram representing circuit arrangement and the flow of control signals related to the reading operation in the DRAM macro in accordance with the third embodiment.

The DRAM macro in accordance with the third embodiment is characterized in that equalize/precharge circuit 47 equalizing and precharging read data line pair RDL is arranged opposite to data path 40 with memory array 50 position therebetween.

Equalize/precharge circuit 47 is activated by read data line equalize signal RDLEQ generated by control circuit 30. The read data line equalize signal is transmitted as a signal RDLEQh to each equalize/precharge circuit 47 through buffer circuit 80.

The problem experienced when equalize/precharge circuit 47 is arranged in data path 40 will be described.

In the present invention, a method of increasing speed of operation in a reading operation has been described in which the direction of propagation of read predecode signals YAR <3:0> and YBR <3:0> and the direction of propagation of the read data driven to the read data line pair RDL from the sense amplifier by the read column selection line are aligned. Considering the equalize/precharge operation for read data line pair RDL, however, when the equalize/precharge circuit is arranged on the same side as preamplifier 42, that is, data path 40, the transition from once activated read predecode signal to the inactive state is transmitted from the upper to the lower portion of the figure, while the read data line pair is driven by the equalize/precharge circuit in a direction from the lower to the upper portion of the figure. Namely, the direction of inactivating the read column selecting line is opposite to the direction of driving the read data line pair by the equalize/precharge circuit.

Therefore, when the start of equalize/precharge operation is timed with inactivation of the column selection line at the sense amplifier SAf at the farthest point and the sense amplifier SAn at the nearest point is selected, the equalize/precharge operation for the corresponding read data line starts prematurely before the read column selection line is inactivated, because of the influence of line delay in propagating the read predecode signal. This results in a through current between the equalize/precharge circuit and the read gate.

Figure 17:
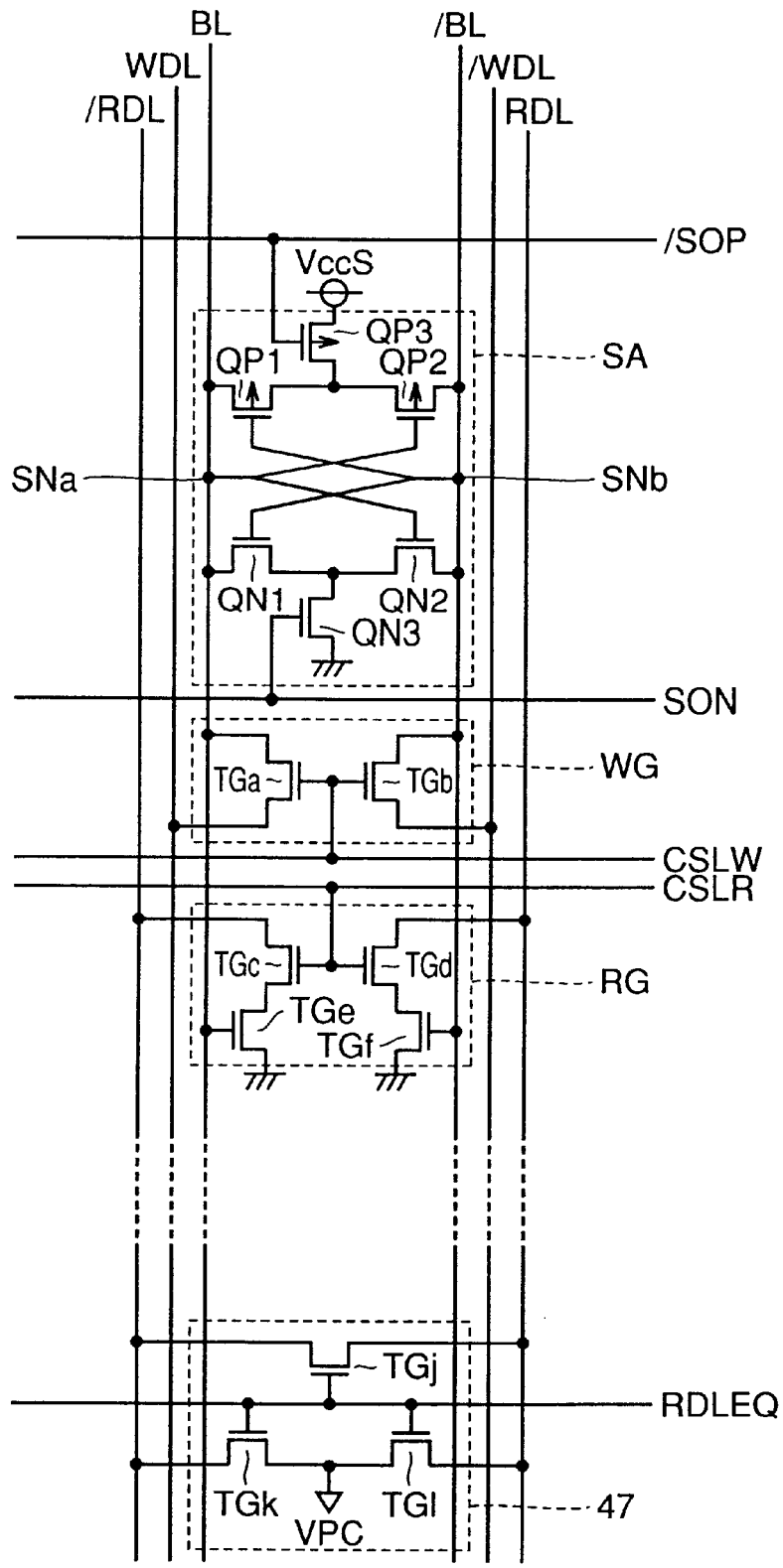
FIG. 17 is a circuit diagram related to generation of a through current between an equalize/precharge circuit and a read gate.

FIG. 17 is a circuit diagram representing generation of through current between the equalize/precharge circuit and the read gate.

Referring to FIG. 17, corresponding to the read data line pair, the equalize/precharge circuit 47 is provided, which is activated in response to the read data line equalize signal RDLEQ for precharging and equalizing RDL and /RDL constituting the read data line pair to the precharged voltage VPC.

The configurations of sense amplifier SA, read gate RG and write gate WG are as described with reference to FIG. 3. Therefore, description thereof is not repeated.

Equalize/precharge circuit 47 has an N channel MOS transistor TGj which is rendered conductive when read data line equalize signal RDLEQ is activated, for short-circuiting RDL and /RDL constituting the read data line pair, and N channel MOS transistors TGk and TGl rendered conductive when the read data line equalize signal RDLEQ is activated, for transmitting the precharge voltage VPC to RDL and /RDL constituting the read data line pair, respectively.

When the equalize/precharge operation starts before the read column selection line is inactivated, the transistors TGk and TGl in equalize/precharge circuit 47 are turned on, regardless of the fact that transistors TGc and TGd in the read gate RG are on. Thus, a path coupling the read data line pair RDL and /RDL to the precharge voltage is formed, and unnecessary through current is generated through the path of VPC-TGl-RDL-TGd-TGf-ground line, or VPC-TGk-/RDL-TGc-TGe-ground line.

In order to prevent such a through current, the equalize/precharge operation should be started timed with inactivation of the sense amplifier SAn at the nearest point. If the equalize/precharge operation is defined with such a timing, however, the minimum cycle time in the read operation would be made longer.

Accordingly, the equalize/precharge circuit for the read data line pair is positioned opposite to data path 40 where the preamplifier 40 is arranged, as shown in FIG. 16. Thus, the direction in which the read data line pair is driven at the time of equalize/precharge operation is made equal to the direction of propagation of the read predecode signals YAR <3:0> and YBR <3:0>. Thus, generation of the through current can be prevented without increasing the minimum cycle time caused by the influence of line delay in propagating the read predecode signals.

The configuration of the third embodiment is similarly applicable to the DRAM macro having the configuration of FIG. 4 in accordance with the first embodiment in which the read column selection lines are arranged in the same direction as the read data line pair. More specifically, in the circuit configuration of FIG. 4, equalize/precharge circuit 47 may be arranged opposite to preamplifier 42 to attain similar effects as described in the third embodiment.

Fourth Embodiment

Figure 18:
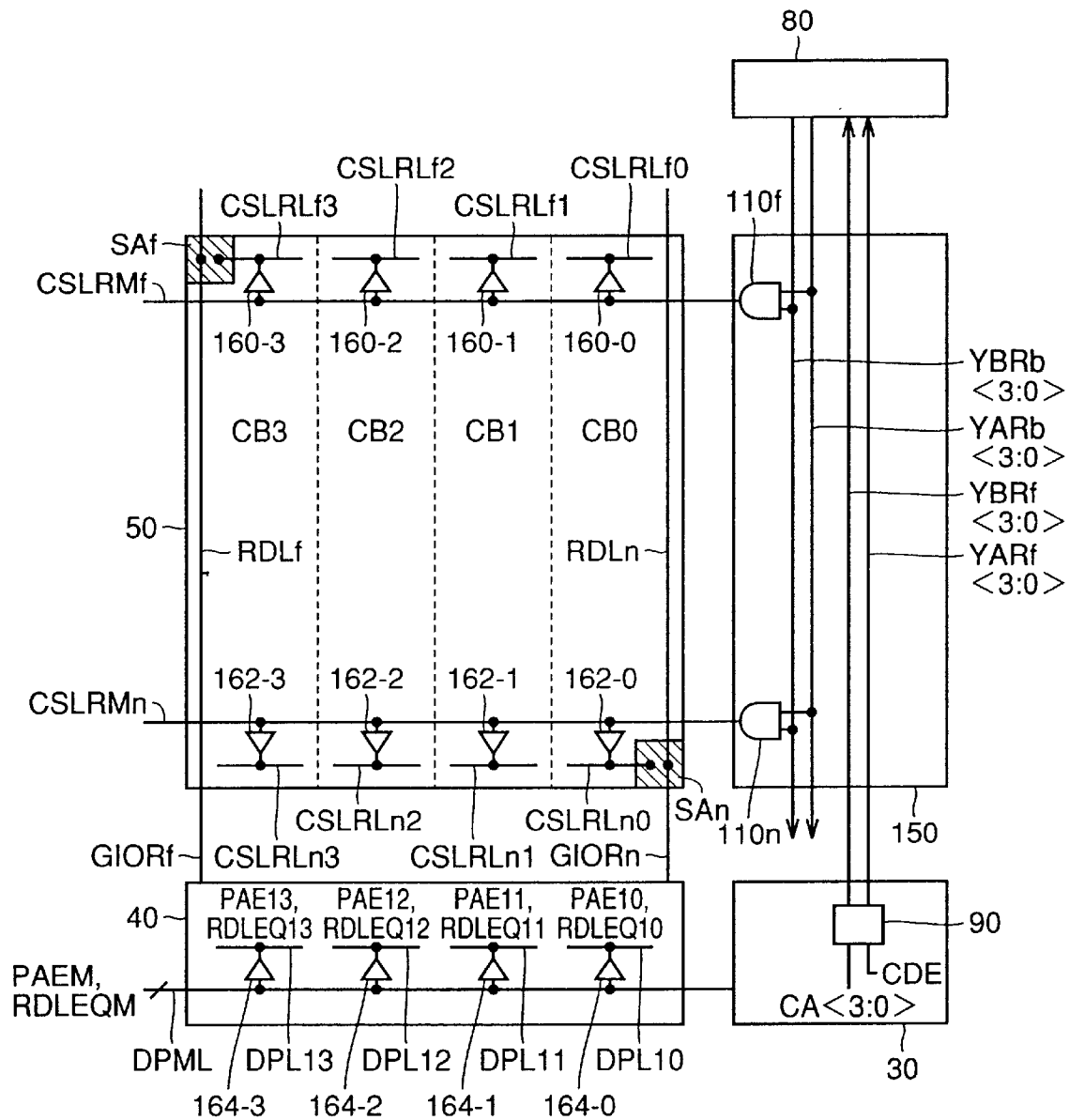
FIG. 18 is a block diagram representing circuit arrangement and flow of control signals related to the reading operation in the DRAM macro in accordance with a fourth embodiment.
Figure 19:
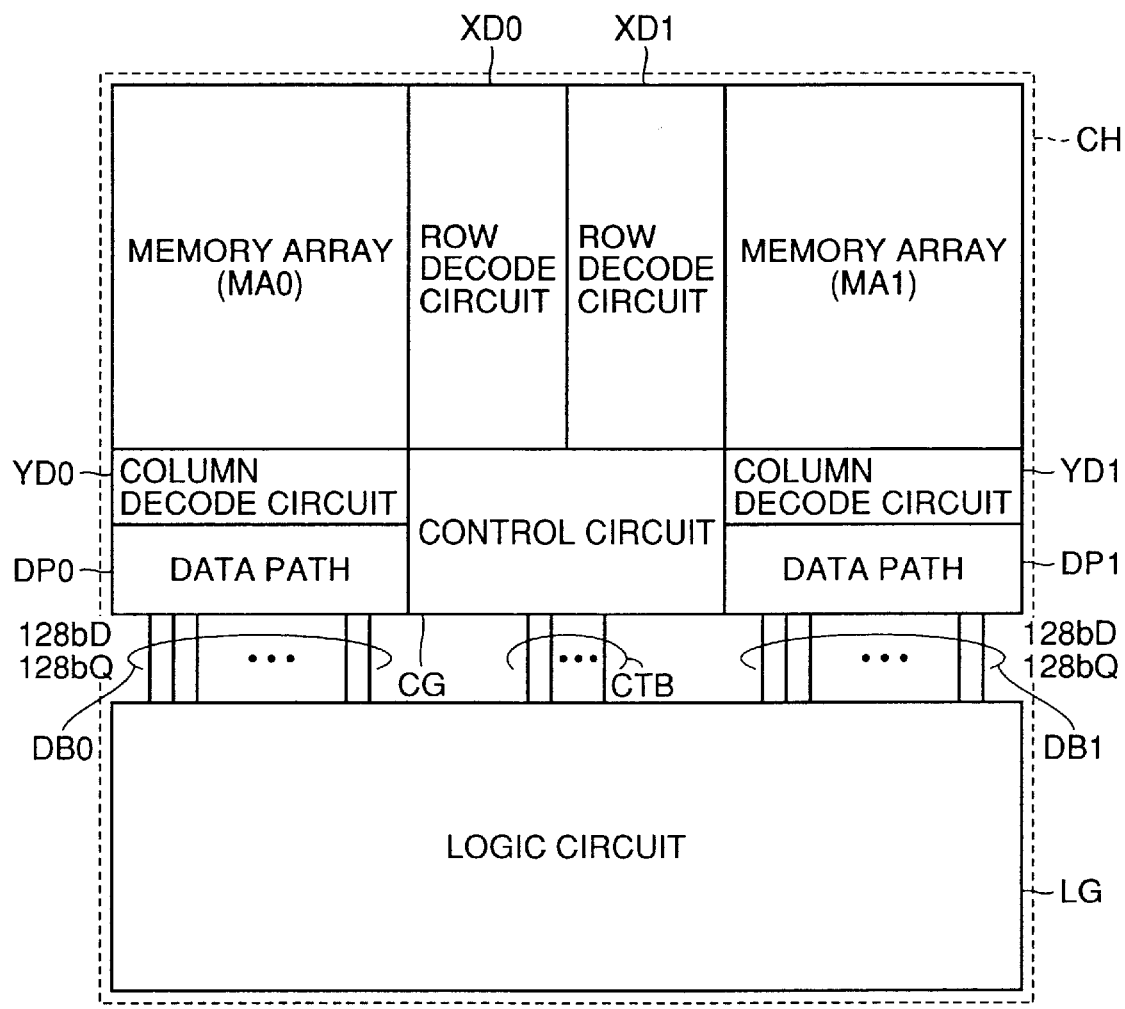
FIG. 19 represents an example of the configuration of conventional DRAM embedded system LSI.
Figure 20:
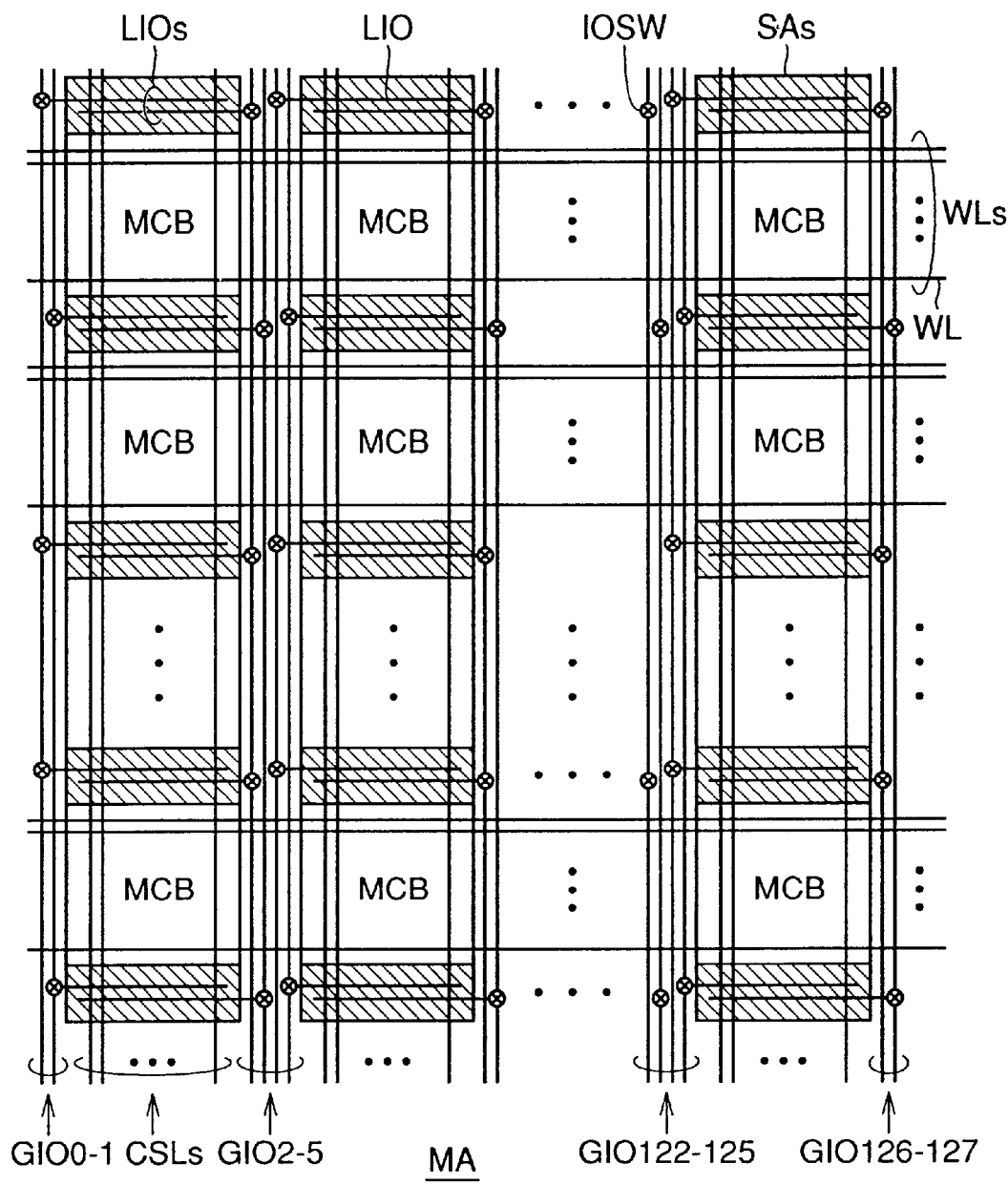
FIG. 20 is a schematic diagram representing a configuration of a memory array portion of the conventional DRAM macro.
Figure 21:
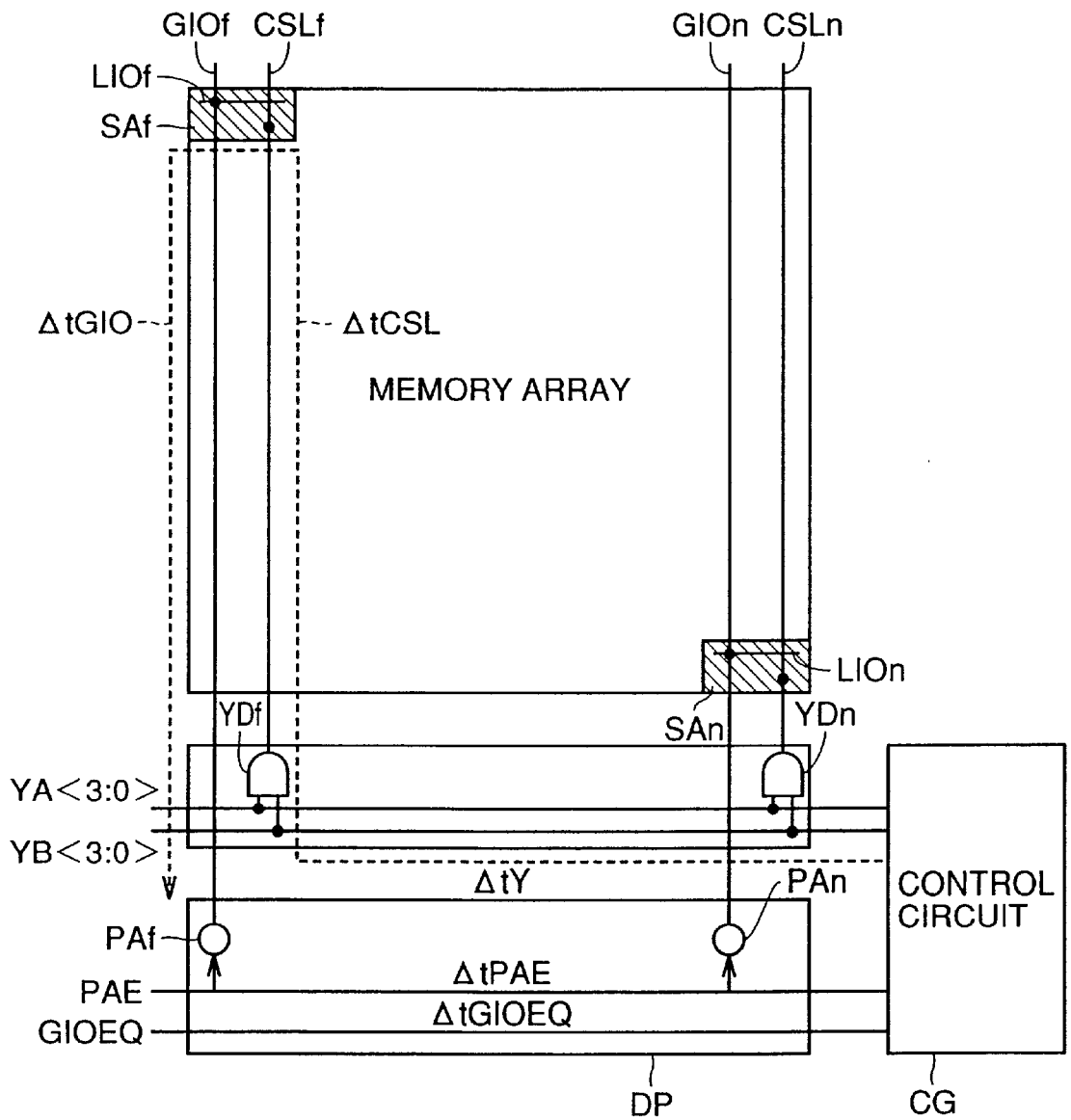
FIG. 21 is a block diagram representing circuit arrangement and flow of control signals related to the reading operation in the conventional DRAM macro.

FIG. 18 is a block diagram representing circuit arrangement and the flow of control signals related to the reading operation in the DRAM macro in accordance with the fourth embodiment of the present invention.

Referring to FIG. 18, in the fourth embodiment, memory array 50 is divided into a plurality of column blocks along the column direction. FIG. 18 shows an example in which the memory array is divided into four column blocks CB0 to CB3. Further, the preamplifier activating signal PAE and the read data line equalize signal RDLEQ transmitted over the data path are transmitted below a hierarchical configuration.

Generally, in a DRAM embedded system LSI, a large number of data line pairs are arranged over the memory array in order to ensure wide data bus width, and as a result, the number of preamplifiers or the like is also increased. Therefore, a configuration in which the control signal is controlled under the hierarchical configuration is adapted to activate the preamplifiers and the like at a high speed.

More specifically, the preamplifiers and the equalize/precharge circuits in the data path 40 are activated group by group corresponding to respective column blocks. Respective preamplifiers are controlled in accordance with control signals PAE10 to PAE13 provided corresponding to respective column blocks, and respective equalize/precharge circuits are activated in accordance with control signals RDLEQ10 to RDLEQ13 provided corresponding to respective column blocks.

To the preamplifiers and equalize/precharge circuits corresponding to column block CB0, control signals PAE10 and RDLEQ10 are transmitted over local signal line DPL1O. Similarly, to the preamplifiers and the equalize/precharge circuits corresponding to the column block CB1, control signals PAE11 and RDLEQ11 are transmitted over local signal line DPL11. To the preamplifiers and equalize/precharge circuits corresponding to column block CB2, control signals PAE12 and RDLEQ12 are transmitted over local signal line DPL12, and to the preamplifiers and the equalize/precharge circuits corresponding to column block CB3, control signals PAE13 and RDLQ13 are transmitted over local signal line DPL13.

As signals designating timing of activating the preamplifier and the equalize/precharge circuit, control signals PAEM and RDLEQM are transmitted as signals common to respective column blocks, over main signal line DPML. Between the main signal line DPML and local signal lines DPL10 to DPL13, buffers 164-0 to 164-3 are provided, respectively.

The fourth embodiment is characterized in that when transmission of control signals over data bus 40 has hierarchical configuration corresponding to column blocks, driving of column selection lines also has hierarchical configuration correspondingly. More specifically, a main read column selection line is provided commonly to column blocks CB0 to CB3 corresponding to respective read column selection lines, and local read column selection lines are provided for respective column blocks CB0 to CB3.

For example, corresponding to the main read column selection line CSLRMf provided corresponding to sense amplifier SAf at the farthest point, local read column selection lines CSLRLf0 to CSLRLf3 are provided corresponding to column blocks CB0 to CB3, respectively, and corresponding to the main read column selection line CSLRMn provided corresponding to sense amplifier SAn at the nearest point, local read column selection lines CSLRLn0 to CSLRLn3 are provided corresponding to column blocks CB0 to CB3, respectively.

The read column selection signal generated by read column decoder 110f is transmitted by main read column selection line CSLRMf, and transmitted to respective local read column selection lines CSLRLf0 to CSLRLf3 through buffers 160-0 to 160-3, respectively.

In this manner, when the control signals of the data path are adapted to have hierarchical configuration to increase the speed of controlling the data path, the column selection lines are also adapted to have the hierarchical configuration, so that increase in minimum cycle time resulting from the increased difference in propagation delay of the read column selection signal generated on the read column selection line and the propagation delay of control signals PAE and RDLEQ related to the data path can be prevented.

Though a DRAM macro in a DRAM embedded system LSI has been described as the semiconductor memory device in accordance with the present invention in the specification, application of the present invention is not limited thereto. For example, the present invention is also applicable to such a configuration that exchanges data directly with the outside by providing input/output terminals in place of the data bus and the control bus, as well as to such configuration that communicates data with the logic circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array having a plurality of memory cells arranged in a matrix of rows and columns, said memory cell array being divided into a plurality of sub row arrays along row direction;
   a plurality of sense amplifiers provided for said plurality of sub row arrays, each provided corresponding to the column of memory cells;
   a plurality of read data lines provided commonly to said plurality of sub row arrays, one for every N columns of said memory cells (N: natural number not smaller than 2);
   a read data amplifying circuit for amplifying a data signal on each of said read data lines;
   a plurality of read gate circuits each provided between a corresponding one of said plurality of sense amplifiers and a corresponding one of said plurality of read data lines, each for transmitting the data signal to the corresponding one of said plurality of read data lines in response to a corresponding one of a plurality of column selection signals;
   a plurality of column selection lines for transmitting said plurality of column selection signals to said plurality of read gate circuits; and
   a column decode circuit for generating said plurality of column selection signals to select one of N columns of memory cells corresponding to each of said read data lines, said column decode circuit providing the column selection signal to the column selection line earlier as the distance between a corresponding read gate circuit and said read data amplifying circuit is longer.

2. The semiconductor memory device according to claim 1, wherein
   each of said plurality of column selection lines is arranged commonly to said plurality of sub row arrays in the same direction as said plurality of read data lines; and
   said column decode circuit and said read data amplifying circuit are arranged in areas opposite to each other with said memory cell array positioned therebetween.

3. The semiconductor memory device according to claim 2, wherein
   said column decode circuit includes a plurality of column decoders each provided corresponding to each of said plurality of column selection lines;
   said read data amplifying circuit includes a plurality of preamplifiers each provided corresponding to each of said plurality of read data lines;
   said semiconductor memory device further comprises
   a control circuit arranged adjacent to said read data amplifying circuit for controlling an access operation to said memory cell, and including a read predecode circuit generating a plurality of read predecode signals having information of activation timing of said plurality of column selection signals and information of result of predecoding an input address signal for selecting a memory cell in a reading operation,
   a buffer circuit arranged adjacent to said column decode circuit,
   a plurality of first signal lines provided in the same direction as said plurality of read data lines for transmitting said plurality of read predecode signals from said control circuit to said buffer circuit,
   a plurality of second signal lines provided in a direction crossing said plurality of read data lines, for transmitting said plurality of read predecode signals from said buffer circuit to said plurality of column decoders, and
   a third signal line provided in a direction crossing said plurality of read data lines for transmitting an activation control signal from said control circuit to said plurality of preamplifiers, and
   each of the column decoders receives said plurality of read predecode signals from the second signal lines to generate a corresponding one of said column selection signals.

4. The semiconductor memory device according to claim 2, wherein
   said column decode circuit includes a plurality of column decoders each provided corresponding to each of said plurality of column selection lines;
   said read data amplifying circuit includes a plurality of preamplifiers each provided corresponding to each of said plurality of read data lines;
   said semiconductor memory device further comprises
   a control circuit arranged adjacent to said read data amplifying circuit for controlling an access operation to said memory cell, and including a signal generating circuit generating a plurality of address information signals having information of activation timing of said plurality of column selection signals and information of respective bits of an input address signal for selecting a memory cell in a reading operation,
   a read predecode circuit arranged adjacent to said column decode circuit and generating a plurality of read predecode signals by predecoding said plurality of address information signals,
   a plurality of first signal lines provided in the same direction as said plurality of read data lines and transmitting said plurality of address information signals from said control circuit to said read predecode circuit,
   a plurality of second signal lines provided in a direction crossing said plurality of read data lines and transmitting said plurality of read predecode signals from said read predecode circuit to the column decoders, and a third signal line provided in a direction crossing said plurality of read data lines for transmitting an activation control signal from said control circuit to said plurality of preamplifiers; and each of said plurality of column decoders receives the read predecode signals from the second signal lines to generate a corresponding one of said column selection signals.

5. The semiconductor memory device according to claim 1, wherein said read data amplifying circuit is arranged in an area adjacent in column direction to said memory cell array;

said column decode circuit includes a plurality of column decoders arranged in an area adjacent in row direction to said memory cell array and each provided corresponding to each of said plurality of column selection lines;

said plurality of column selection lines are provided in a direction crossing the plurality of read data lines; and said semiconductor memory device further comprises a control circuit arranged adjacent to said read data amplifying circuit for controlling access operation to said memory cell, and a signal supplying circuit receiving a control signal generated by said control circuit and supplying the signal to the column decoder earlier as the distance from said control circuit is longer.

6. The semiconductor memory device according to claim 5, wherein said control signal includes a plurality of read predecode signals having information of activation timing of said column selection signals and information of result of predecoding an input address signal for selecting a memory cell in a reading operation;

said signal supplying circuit includes a buffer circuit arranged opposite to said control circuit with said plurality of column decoders positioned therebetween;

said read data amplifying circuit includes a plurality of preamplifiers each provided corresponding to each of said plurality of read data lines;

said semiconductor memory device further comprises a plurality of first signal lines provided in the same direction as said plurality of read data lines and transmitting said plurality of read predecode signals from said control circuit to said buffer circuit, a plurality of second signal lines provided in the same direction as said plurality of read data lines and transmitting said plurality of read predecode signals from said buffer circuit to said plurality of column decoders; and a third signal line provided in a direction crossing said plurality of read data lines and transmitting an activation control signal to said plurality of preamplifiers from said control circuit; and each of said plurality of column decoders receives the read predecode signals from the second signal lines to generate a corresponding column selection signal.

7. The semiconductor memory device according to claim 6, wherein said plurality of read predecode signals include a plurality of first read predecode sub signals having information of activation timing of said column selection signals and information of result of predecoding at least one bit of said input address signal, and a plurality of second read predecode sub signals having information of result of predecoding remaining bits of said input address signal;

said plurality of first signal lines transmit said plurality of first and second read predecode sub signals;

said plurality of second signal lines transmit said plurality of first read predecode sub signals; and each of said plurality of column decoders receives the first read predecode sub signal from the second signal line and receives the second read predecode sub signal from the first signal line, to generate said corresponding column selection signal.

8. The semiconductor memory device according to claim 5, wherein said control signal includes a plurality of address information signals having information of activation timing of said column selection signals and information of respective bits of an input address signal for selecting a memory cell in a reading operation;

said signal supplying circuit includes a read predecode circuit arranged opposite to said control circuit with said plurality of column decoders placed therebetween, and generating a plurality of read predecode signals by predecoding said plurality of address information signals;

said read data amplifying circuit includes a plurality of preamplifiers provided corresponding to said plurality of read data lines, respectively;

said semiconductor memory device further comprises a plurality of first signal lines provided in the same direction as said plurality of read data lines and transmitting said plurality of address information signals from said control circuit to said read predecode circuit, a plurality of second signal lines provided in the same direction as said plurality of read data lines for transmitting said plurality of read predecode signals from said read predecode circuit to said plurality of column decoders, and a third signal line provided in a direction crossing said plurality of read data lines for transmitting an activation control signal to said plurality of preamplifiers from said control circuit; and each of the column decoders receives said plurality of read predecode signals from the second signal lines to generate a corresponding column selection signal.

9. The semiconductor memory device according to claim 5, wherein said control signal includes a timing control signal controlling activation timing of said column selection signals in a reading operation and a plurality of predecode signals obtained by predecoding an input address signal for selecting a memory cell;

said read data amplifying circuit includes a plurality of preamplifiers each provided corresponding to each of said plurality of read data lines;

said signal supplying circuit includes a buffer circuit arranged opposite to said control circuit with said plurality of column decoders placed therebetween;

said semiconductor memory device further comprises a first signal line provided in the same direction as said plurality of read data lines and transmitting said timing control signal from said control circuit to said buffer circuit, a second signal line provided in the same direction as said plurality of read data lines and transmitting said timing control signal from said buffer circuit to said control circuit, a plurality of third signal lines provided in the same direction as said plurality of read data lines and transmitting said plurality of predecode signals from said buffer circuit to said plurality of column decoders, and a fourth signal line provided in a direction crossing said plurality of read data lines and transmitting an activation control signal from said control circuit to said plurality of preamplifiers; and each of said plurality of column decoders receives said timing control signal from said second signal line and receives the predecode signals from the third signal lines to generate a corresponding column selection signal.

10. The semiconductor memory device according to claim 5, wherein said memory cell array is divided into a plurality of column blocks along column direction;

said semiconductor memory device further comprises a preamplifier control signal line provided in a direction crossing said plurality of read data lines for transmitting an activation control signal from said control circuit to said read data amplifying circuit; wherein said preamplifier control signal line includes a main control signal line provided commonly to said plurality of column blocks, and a plurality of local control signal lines each provided corresponding to each of said plurality of column blocks and coupled to said main control signal line; and each of said plurality of column selection lines includes a main column selection line provided commonly to said plurality of column blocks, and a plurality of local column selection lines each provided corresponding to each of said plurality of column blocks and coupled to said main column selection line.

11. The semiconductor memory device according to claim 1, further comprising a plurality of precharge circuits each provided corresponding to each of said plurality of read data lines, for setting said plurality of read data lines temporarily to a prescribed potential level prior to transmission of read data; wherein each of said plurality of precharge circuits is arranged such that the distance from the read gate circuit is longer as the distance between the read gate circuit and said read data amplifying circuit is shorter.

12. The semiconductor memory device according to claim 11, wherein said plurality of precharge circuits and said read data amplifying circuit are arranged in areas opposite to each other with said memory cell array placed therebetween.

13. The semiconductor memory device according to claim 1, further comprising first and second power supplies for supplying an operational voltage to the sense amplifiers; wherein in each of said sub row arrays, two sense amplifiers corresponding to continuous two columns of memory cells are supplied with said operational voltage from different ones of said first and second power supplies.

14. The semiconductor memory device according to claim 13, wherein said plurality of sense amplifiers are arranged in areas adjacent in column direction to said sub row arrays; and the sense amplifiers connected to said first power supply are arranged opposite to the sense amplifiers connected to said second power supply with said sub row array placed therebetween.

* * * * *